United States Patent
Shen et al.

(10) Patent No.: US 11,211,479 B2
(45) Date of Patent: Dec. 28, 2021

(54) METHOD OF FABRICATING TRIMMED FIN AND FIN STRUCTURE

(71) Applicant: TAIWAN SEMICONDUCTOR MANUFACTURING CO., LTD., Hsinchu (TW)

(72) Inventors: Yu-Cheng Shen, Hsinchu (TW); Guan-Jie Shen, Hsinchu (TW)

(73) Assignee: TAIWAN SEMICONDUCTOR MANUFACIURING CO., LTD., Hsinchu (TW)

( * ) Notice: Subject to any disclaimer, the term of this patent is extended or adjusted under 35 U.S.C. 154(b) by 218 days.

(21) Appl. No.: 16/155,712

(22) Filed: Oct. 9, 2018

(65) Prior Publication Data
US 2020/0058773 A1 Feb. 20, 2020

Related U.S. Application Data

(60) Provisional application No. 62/718,963, filed on Aug. 14, 2018.

(51) Int. Cl.
| | |
|---|---|
| H01L 29/66 | (2006.01) |
| H01L 21/02 | (2006.01) |
| H01L 21/762 | (2006.01) |
| H01L 29/06 | (2006.01) |
| H01L 29/161 | (2006.01) |
| H01L 29/10 | (2006.01) |
| H01L 29/78 | (2006.01) |

(52) U.S. Cl.
CPC .. *H01L 29/66818* (2013.01); *H01L 21/02236* (2013.01); *H01L 21/76224* (2013.01); *H01L 29/0649* (2013.01); *H01L 29/1054* (2013.01); *H01L 29/161* (2013.01); *H01L 29/7851* (2013.01)

(58) Field of Classification Search
CPC ........... H01L 29/66818; H01L 29/0649; H01L 29/1054; H01L 29/161; H01L 29/7851; H01L 21/02236; H01L 21/76224
See application file for complete search history.

(56) References Cited

U.S. PATENT DOCUMENTS

| | | | |
|---|---|---|---|
| 6,071,790 A * | 6/2000 | Tsai | ..................... H01L 27/1085 257/E21.013 |
| 9,093,530 B2 | 7/2015 | Huang et al. | |
| 9,171,929 B2 | 10/2015 | Lee et al. | |
| 9,214,555 B2 | 12/2015 | Oxland et al. | |
| 9,236,267 B2 | 1/2016 | De et al. | |
| 9,412,850 B1 * | 8/2016 | Chuang | ............. H01L 29/66795 |
| 9,508,834 B1 * | 11/2016 | Lee | ...................... H01L 29/0653 |
| 9,520,482 B1 | 12/2016 | Chang et al. | |
| 9,548,303 B2 | 1/2017 | Lee et al. | |

(Continued)

*Primary Examiner* — Lex H Malsawma
(74) *Attorney, Agent, or Firm* — Maschoff Brennan

(57) ABSTRACT

A method of fabricating a trimmed fin includes: forming a preliminary fin including silicon and germanium protruding from a substrate, in which the preliminary fin has a first germanium concentration at a top surface of the preliminary fin and a second germanium concentration at a position beneath the top surface of the preliminary fin, and the first germanium concentration is less than the second germanium concentration; oxidizing an exposed surface of the preliminary fin to form a trimmed fin covered by an oxide layer; and removing the oxide layer to obtain the trimmed fin.

20 Claims, 22 Drawing Sheets

(56) References Cited

U.S. PATENT DOCUMENTS

| | | | |
|---|---|---|---|
| 9,564,489 B2 | 2/2017 | Yeo et al. | |
| 9,576,814 B2 | 2/2017 | Wu et al. | |
| 9,601,342 B2 | 3/2017 | Lee et al. | |
| 9,608,116 B2 | 3/2017 | Ching et al. | |
| 10,141,311 B2* | 11/2018 | Glass | H01L 29/66818 |
| 10,439,044 B1* | 10/2019 | Lee | H01L 21/3083 |
| 10,468,409 B2* | 11/2019 | Lee | H01L 27/10879 |
| 10,522,662 B1* | 12/2019 | Lin | H01L 29/66545 |
| 10,707,208 B2* | 7/2020 | Cheng | H01L 29/1083 |
| 2007/0221956 A1* | 9/2007 | Inaba | H01L 21/823878 |
| | | | 257/197 |
| 2011/0147811 A1* | 6/2011 | Kavalieros | H01L 29/7851 |
| | | | 257/288 |
| 2014/0170839 A1* | 6/2014 | Brunco | H01L 29/1054 |
| | | | 438/479 |
| 2015/0102386 A1* | 4/2015 | Chen | H01L 29/0649 |
| | | | 257/192 |
| 2016/0322501 A1* | 11/2016 | Cheng | H01L 29/165 |
| 2018/0053824 A1* | 2/2018 | Wang | H01L 21/76224 |
| 2018/0358452 A1* | 12/2018 | Qi | H01L 29/78618 |
| 2019/0131177 A1* | 5/2019 | Brunco | H01L 29/6653 |
| 2019/0164969 A1* | 5/2019 | Leib | H01L 21/0337 |
| 2019/0214306 A1* | 7/2019 | Chen | H01L 29/0653 |

* cited by examiner

METHOD OF FABRICATING TRIMMED FIN AND FIN STRUCTURE

RELATED APPLICATIONS

This application claims priority to U.S. Provisional Application Ser. No. 62/718,963, filed Aug. 14, 2018, which is herein incorporated by reference.

BACKGROUND

The semiconductor integrated circuit (IC) industry has experienced rapid growth. Over the course of the growth, functional density of the semiconductor devices has increased with decrease of device feature size or geometry. The scaling down process generally provides benefits by increasing production efficiency, reducing costs, and/or improving device performance.

With the demands on shrinking geometry of ICs, a three dimensional transistor, such as a fin-like field-effect transistor (FinFET), has been introduced to replace a planar transistor. However, device performance of such FinFET is still not satisfactory in advanced applications of technology. Therefore, improvements in structures and methods of manufacturing a FinFET with better device performance continue to be sought.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
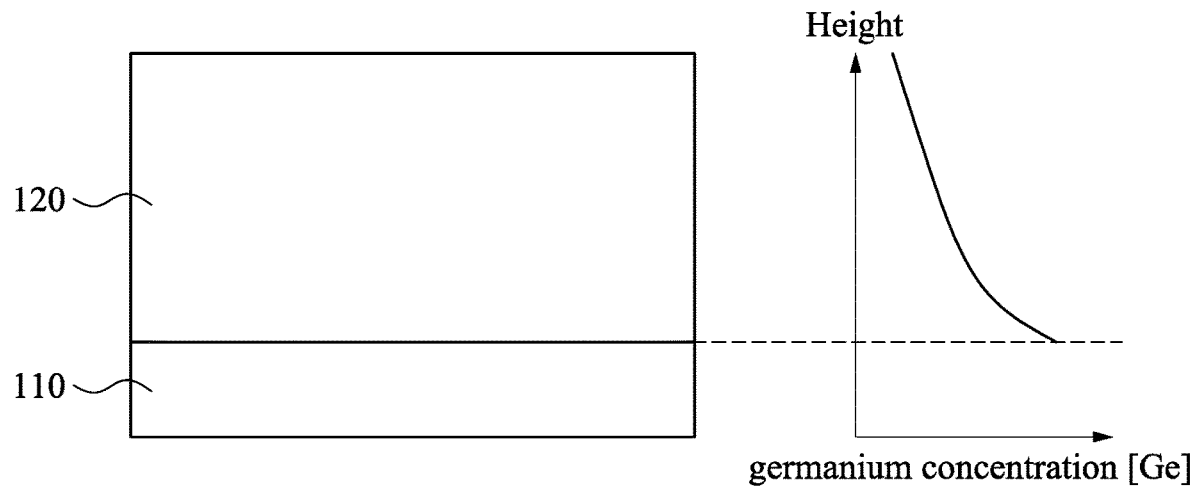
FIGS. 1-5 are cross-sectional views at various stages of fabricating a trimmed fin in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable percentage (e.g., +/−10%) of the number described as understood by a person having ordinary skill in the art, unless otherwise specified. For example, the term "about 5 nm" encompasses the dimension range from 4.5 nm to 5.5 nm.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the embodiments. As used herein, the term "and/or" includes any and all combinations of one or more of the associated listed items.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

As mentioned above, device performance of the FinFET is still not satisfactory in advanced applications of technology. For example, the current FinFET structure may still have some performance drawbacks, such as local sparse current density, undesirable leakage path, significant drain induced barrier lowering (DIBL) and subthreshold swing (SS) degradation. It is found that due to current process limitation, a fin bottom width is usually larger than a fin top width. The wider bottom of the fin causes the above-mentioned performance drawbacks. Therefore, the present disclosure provides a method of fabricating a trimmed fin to solve the issues above. Embodiments of the method of fabricating the trimmed fin will be described below in detail.

FIGS. 1-5 are cross-sectional views at various stages of fabricating a trimmed fin in accordance with some embodiments of the present disclosure.

In some embodiments, as shown in FIG. 1, a semiconductor layer 120 is formed over a substrate 110. In some embodiments, the substrate 110 includes an elementary semiconductor, such as silicon or germanium in crystal, polycrystalline, or an amorphous structure; a compound semiconductor, such as silicon carbide, gallium arsenide, gallium phosphide, indium phosphide, indium arsenide, and/or indium antimonide, or combinations thereof; or an alloy semiconductor, such as silicon germanium (SiGe), gallium arsenide phosphide (GaAsP), aluminum indium arsenide (AlInAs), aluminium gallium arsenide (AlGaAs), gallium indium arsenide (GaInAs), gallium indium phosphide (GaInP), and/or gallium indium arsenide phosphide (GaInAsP), or combinations thereof. In some embodiments, the substrate 110 is an n-type or p-type semiconductor substrate. In some embodiments, the substrate 110 includes a silicon-on-insulator (SOI) substrate, silicon germanium-on-insulator (SGOI), germanium-on-insulator (GOI) substrate, or a combination thereof. In some embodiments, the substrate 110 is stressed or strained to enhance performance of the device.

In some embodiments, the semiconductor layer 120 includes silicon and germanium. In some embodiments, as shown in FIG. 1, the semiconductor layer 120 is formed by epitaxially growing semiconductor material over the substrate 110. Epitaxial growth includes heteroepitaxial growth, homoepitaxial growth, and/or other suitable epitaxial growth processes. In some embodiments, silicon and/or germanium is heteroepitaxially grown on the substrate 110 to form the semiconductor layer 120. In some embodiments, silicon and/or germanium is homoepitaxially grown on the substrate 110 to form the semiconductor layer 120. In some embodiments, the substrate 110 is a silicon germanium strain relaxed buffer, silicon germanium substrate, silicon substrate, germanium substrate, silicon-on-insulator (SOI) substrate, germanium-on-insulator (GOI) substrate, or silicon germanium-on-insulator (SGOI) substrate.

In some embodiments, the semiconductor layer 120 is formed over the substrate 110 by an ion implantation process. In some examples, silicon ions are implanted into a germanium bulk substrate to form the semiconductor layer 120 over the germanium substrate 110. In some examples, germanium ions are implanted into a silicon bulk substrate to form the semiconductor layer 120 over the silicon substrate 110. In some embodiments, a thermal process, such as a rapid thermal process, is then performed on the semiconductor layer 120. In some embodiments, an annealing process, such as a rapid thermal annealing process (RTA), is then performed on the semiconductor layer 120 to repair damage from ion implantation and to allow ion activation.

In some embodiments, the formed semiconductor layer 120 is a relaxed semiconductor layer 120 or a strained semiconductor layer 120. Either the relaxed semiconductor layer 120 or the strained semiconductor layer 120 may be used to enhance carrier mobility and/or optical properties, thereby improving the performance of the semiconductor device.

As shown in FIG. 1, the semiconductor layer 120 includes silicon and germanium. The semiconductor layer 120 has a germanium concentration profile. In some embodiments, the germanium concentration at a top surface of the semiconductor layer 120 is less than the germanium concentration at a position beneath the top surface of the semiconductor layer 120. In some embodiments, the top surface of the semiconductor layer 120 has $Si_{1-x}Ge_x$, and the position beneath the top surface of the semiconductor layer 120 has $Si_{1-y}Ge_y$, in which x and y represents a real number, and x is greater than or equal to 0, and y is less than or equal to 1, and y minus x is greater than or equal to 0.1.

In some embodiments, the germanium concentration is gradually increased from the top surface of the semiconductor layer 120 to a bottom of the semiconductor layer 120. In some embodiments, the semiconductor layer 120 has a maximum germanium concentration at the bottom of the semiconductor layer 120. In some embodiments, the bottom of the semiconductor layer 120 is adjacent to or connected to or in contact with the substrate 110.

Figure 2:
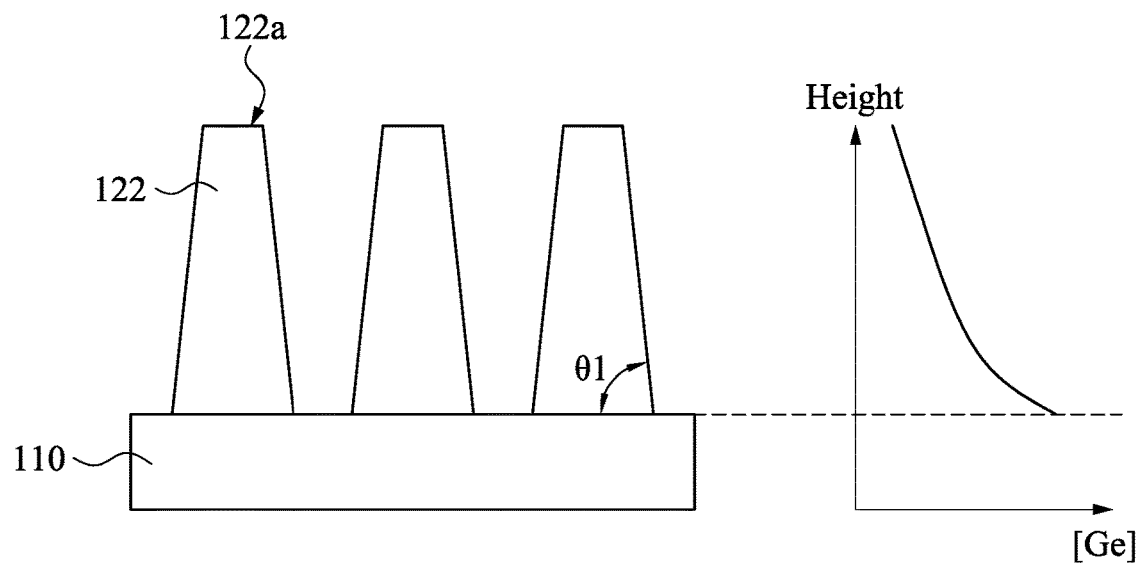

In some embodiments, as shown in FIGS. 1 and 2, the semiconductor layer 120 is patterned to form a preliminary fin 122 including silicon and germanium protruding from the substrate 110. In some embodiments, a plurality of the preliminary fins 122 are formed using photolithography and etching processes. In some embodiments, the photolithography process includes forming a photoresist layer (not shown) overlying the semiconductor layer 120 shown in FIG. 1, exposing the photoresist layer to form a pattern, performing post-exposure bake processes, and developing the pattern to form a masking element. In some embodiments, the etching process is then performed on the semiconductor layer 120 to form trenches, leaving the extending preliminary fins 122, as shown in FIG. 2. In some embodiments, the etching process includes dry etching, wet etching, or a combination thereof. In some embodiments, the etching process includes an anisotropic dry etching process. In some embodiments, the dry etching process uses a process gas including a halogen-containing gas (e.g., hydrogen bromide (HBr) or chlorine ($Cl_2$)), a fluorocarbon-containing gas (e.g., fluoroform ($CHF_3$)), a hydrocarbon-containing gas, oxygen ($O_2$), nitrogen ($N_2$), argon (Ar), hydrogen gas ($H_2$), carbon monoxide (CO), carbon dioxide ($CO_2$), nitrogen monoxide (NO), nitrogen dioxide ($NO_2$), nitrous oxide ($N_2O$), or ammonia ($NH_3$), other suitable gases and/or plasmas, or a combination thereof. In some embodiments, the wet etching process uses a processing agent including hydrogen peroxide ($H_2O_2$), nitric acid ($HNO_3$), hydrogen fluoride (HF), ammonium hydroxide ($NH_4OH$), other suitable processing agents, or a combination thereof. In some embodiments, a reactive ion etching (RIE) process is performed.

In some embodiments, as shown in FIG. 2, a top width of the formed preliminary fin 122 is less than a bottom width thereof. In some embodiments, an angle θ1 between a horizontal cross-sectional plane through the bottom (connected to or in contact with the substrate 110) of the preliminary fin 122 and a side surface thereof is less than 80 degrees.

In some embodiments, the formed preliminary fin 122 has a first germanium concentration at the top surface 122a of the preliminary fin 122 and a second germanium concentration at a position beneath the top surface 122a of the preliminary fin 122, and the first germanium concentration is less than the second germanium concentration. In some embodiments, as shown in FIG. 2, the top surface 122a of the preliminary fin 122 has $Si_{1-x}Ge_x$, and the position beneath the top surface 122a of the preliminary fin 122 has $Si_{1-y}Ge_y$, in which x and y represents a real number, and x is greater than or equal to 0, and y is less than or equal to 1, and y minus x is greater than or equal to 0.1.

In some embodiments, the germanium concentration is gradually increased from the top surface 122a of the preliminary fin 122 to the bottom of the preliminary fin 122. In some embodiments, the preliminary fin 122 has a maximum germanium concentration at the bottom of the preliminary fin 122. In some embodiments, the bottom of the preliminary fin 122 is adjacent to or connected to or in contact with the substrate 110.

Figure 3:
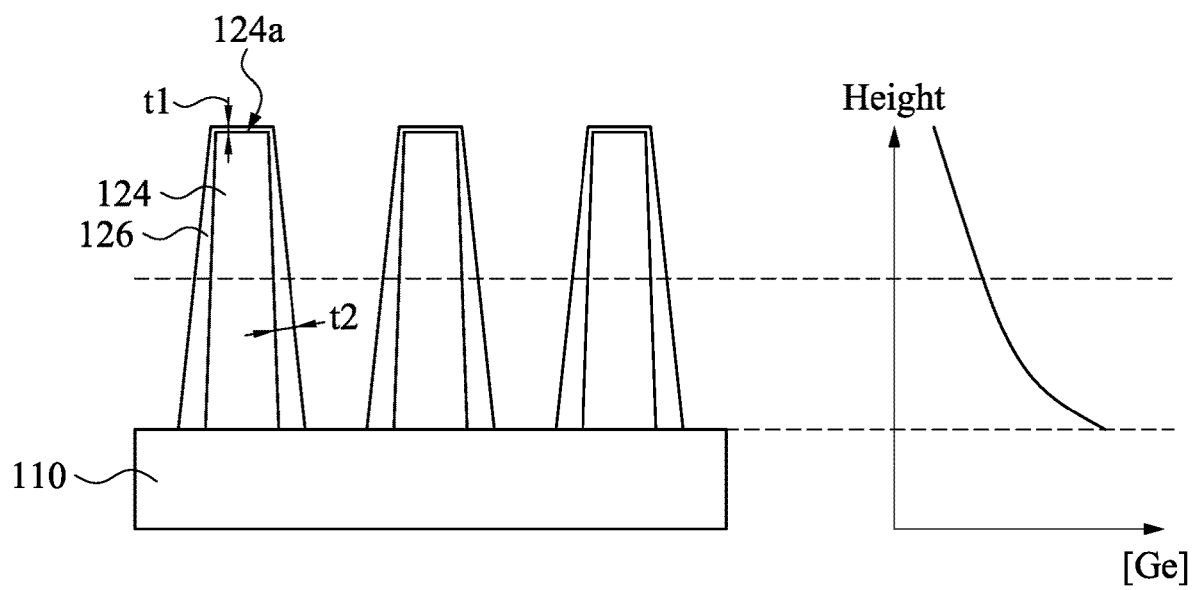

As shown in FIGS. 2 and 3, an oxidation process is performed to oxidize an exposed surface of the preliminary fin 122 to form a trimmed fin 124 covered by an oxide layer 126. The oxide layer 126 can also be called as the surface oxide layer. In some embodiments, the oxidation process includes a dry oxidation process, a wet oxidation process or a combination thereof. In some embodiments, the dry oxidation includes rapid thermal oxidation (RTO), exposure in air, other suitable dry oxidation processes, or a combination thereof. In some embodiments, the wet oxidation includes using a processing agent including hydrogen peroxide ($H_2O_2$), water, other suitable processing agents or a combination thereof. The oxide layer 126 is grown inwardly from an outer surface of the preliminary fin 122, as shown in FIGS. 2 and 3. In some embodiments, the oxide layer 126 includes silicon oxide ($SiO_x$), germanium oxide ($GeO_x$), their suboxides or a combination thereof, in which x is greater than 0 and less than or equal to 4. In some embodiments, x is 2, 3 or 4. In some embodiments, x is less than 2. In some embodiments, the oxide layer 126 includes $SiO_2$ and $GeO_2$.

In some embodiments, the thickness of the formed oxide layer 126 is decided by the germanium concentration of the preliminary fin 122. In other words, the thickness of the formed oxide layer 126 varies with the germanium concentration of the preliminary fin 122. Specifically, the higher the germanium concentration of the preliminary fin 122, the thicker the thickness of the formed oxide layer 126. Therefore, in some embodiments, as shown in FIG. 3, the oxide layer 126 has a first thickness t1 on a top surface 124a of the trimmed fin 124 and a second thickness on a side surface of the trimmed fin, and the first thickness is less than the second thickness. In some embodiments, as shown in FIG. 3, the thickness of the oxide layer 126 is gradually increased from top to bottom.

Figure 4:
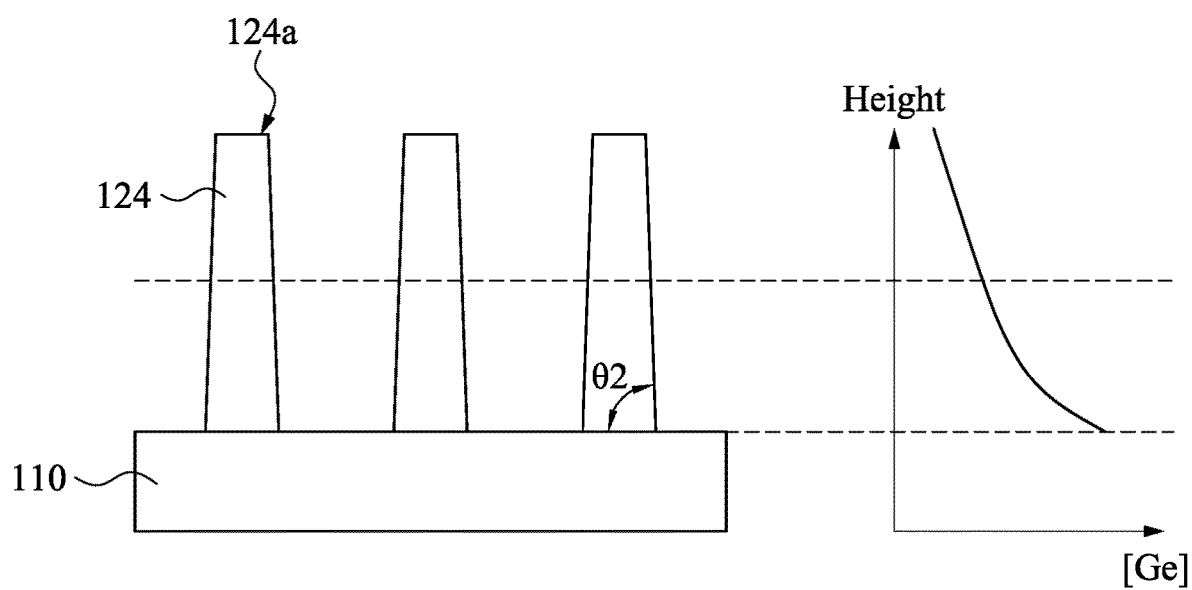

As shown in FIGS. 3 and 4, the oxide layer 126 is removed to obtain the trimmed fin 124. In some embodiments, the oxide layer 126 is removed by a selective etching process, such as a dry etching process, a wet etching process, or a combination thereof. In some embodiments, the dry etching process uses a process gas that includes trifluoromethane ($CHF_3$), nitrogen gas ($N_2$), hydrogen gas ($H_2$), helium (He), argon (Ar), other suitable gases and/or plasmas, or combinations thereof. In some embodiments, the wet etching process uses a processing agent that includes hydrogen fluoride (HF), hydrogen chloride (HCl), hydrogen bromide (HBr), hydrogen peroxide ($H_2O_2$), water, other suitable processing agents, or a combination thereof. In some embodiments, a reactive ion etching (RIE) process may be performed.

In some embodiments, as shown in FIGS. 2 and 4, the fin bottom width is significantly decreased, and thus can solve the issues mentioned above. In some embodiments, an angle θ2 between a horizontal cross-sectional plane through the bottom (connected to or in contact with the substrate 110) of the trimmed fin 124 and a side surface thereof is in a range of from 80 degrees to 100 degrees. In some embodiments, as shown in FIGS. 2 and 4, the angle θ2 is greater than the angle θ1.

In some embodiments, the oxidation process and the surface oxide layer removal process may be repeatedly performed for several times to further narrow the bottom of the trimmed fin 124. In some embodiments, as shown in FIG. 4, after the trimmed fin 124 is obtained, an oxidation process is performed to oxidize an exposed surface of the trimmed fin 124 to form a further trimmed fin (not shown) covered by another oxide layer (not shown). The other oxide layer is then removed to obtain the further trimmed fin.

Figure 5:
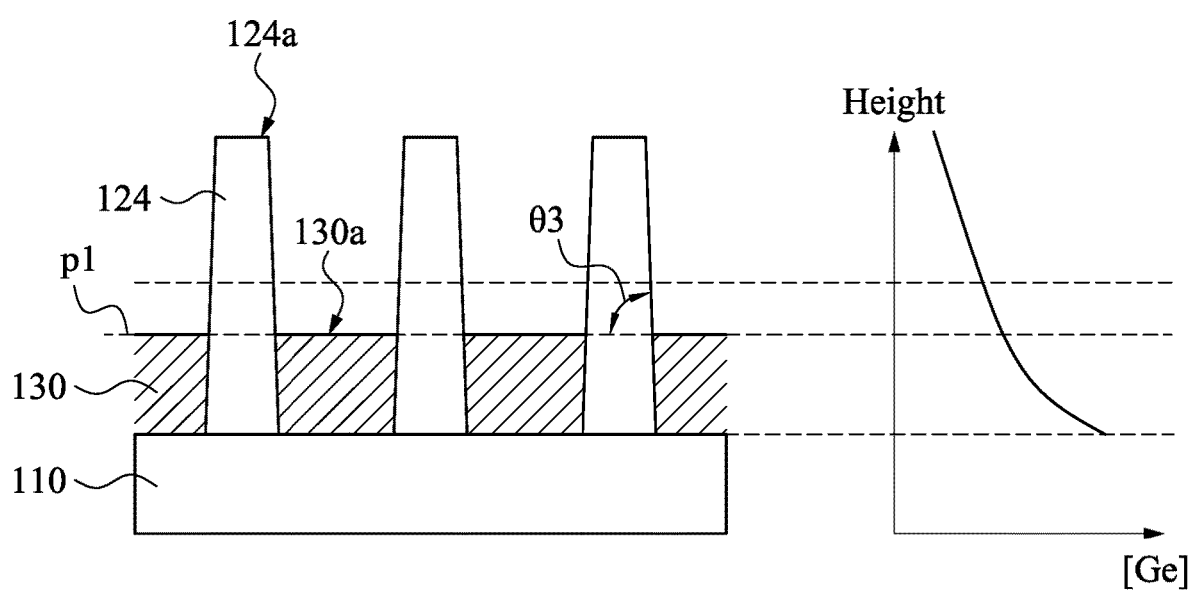

In some embodiments, as shown in FIGS. 4 and 5, an insulating layer 130 is formed laterally adjacent to the bottom of the trimmed fin 124 after the trimmed fin 124 is obtained. In some embodiments, the insulating layer 130 is configured to isolate various active regions. In some embodiments, the insulating layer 130 may be formed using isolation technology, such as local oxidation of silicon (LOCOS) or shallow trench isolation (STI). In some embodiments, the insulating layer 130 includes STI features. In some embodiments, the trenches between the trimmed fins 124 are filled with a dielectric material, and then planarized and recessed to form the STI features 130 and to provide the trimmed fins 124 protruding above the STI features 130. In some embodiments, the insulating layer 130 includes silicon oxide, silicon nitride, silicon oxynitride, fluoride-doped silicate glass (FSG), a low dielectric constant (low-k) dielectric material, other suitable materials or a combination thereof. In some embodiments, the dielectric material is formed using a chemical vapor deposition (CVD) process, a subatmospheric CVD (SACVD) process, a flowable CVD process, an atomic layer deposition (ALD) process, a physical vapor deposition (PVD) process, other suitable processes or a combination thereof.

As shown in FIG. 5, a position p1 of the trimmed fin 124 has a height same as a height of a top surface 130a of the insulating layer 130. In some embodiments, an angle θ3 between a horizontal cross-sectional plane through the position p1 of the trimmed fin 124 and a side surface thereof is in a range of from 80 degrees to 100 degrees. In some embodiments, the trimmed fin 124 has a first germanium concentration at the top surface 124a of the trimmed fin 124 and a second germanium concentration at the position p1 of the trimmed fin 124, and the first germanium concentration is less than the second germanium concentration. In some embodiments, the top surface 124a of the trimmed fin 124 has $Si_{1-x}Ge_x$, and the position p1 of the trimmed fin 124 has $Si_{1-y}Ge_y$, in which x and y represents a real number, and x is greater than or equal to 0, and y is less than or equal to 1, and y minus x is greater than or equal to 0.1.

FIGS. 6-10 are cross-sectional views at various stages of fabricating a trimmed fin in accordance with some embodiments of the present disclosure. Some embodiments of processing steps of FIGS. 6-10 may be same as those of FIGS. 1-5. A difference between the embodiments of FIGS. 6-10 and those of FIGS. 1-5 is the germanium concentration profile of the semiconductor layer, such that the embodiments of FIGS. 6-10 forms a trimmed fin with a different shape.

Figure 6:
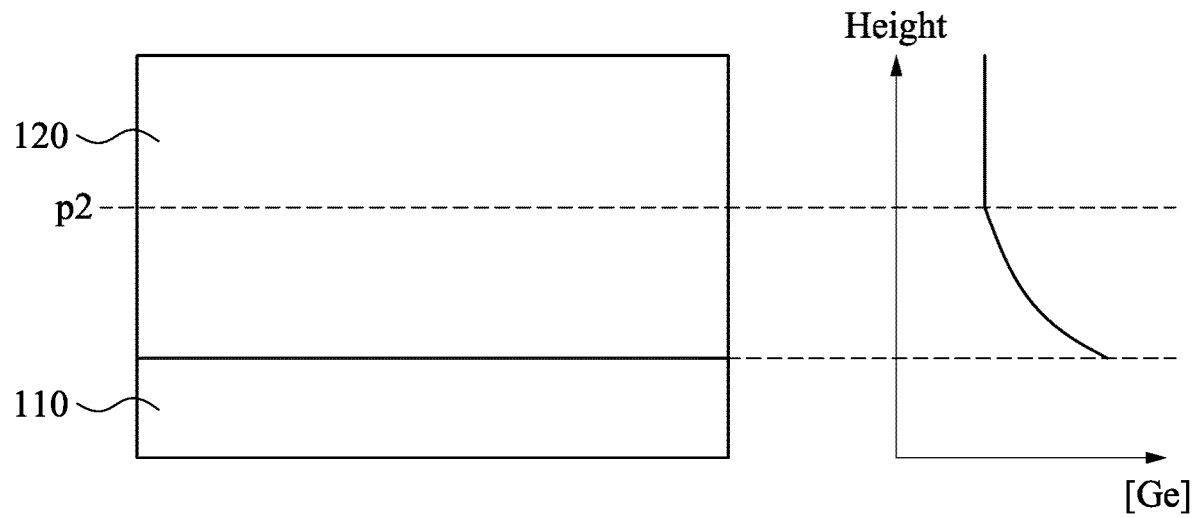
FIGS. 6-10 are cross-sectional views at various stages of fabricating a trimmed fin in accordance with some embodiments of the present disclosure.

Specifically, in some embodiments, as shown in FIG. 6, the germanium concentration of the semiconductor layer 120 is constant from the top surface of the semiconductor layer 120 to a position p2 of the semiconductor layer 120. The position p2 is at an intermediate portion of the semiconductor layer 120. The germanium concentration is gradually increased from the position p2 of the semiconductor layer 120 to a bottom of the semiconductor layer 120.

Figure 7:
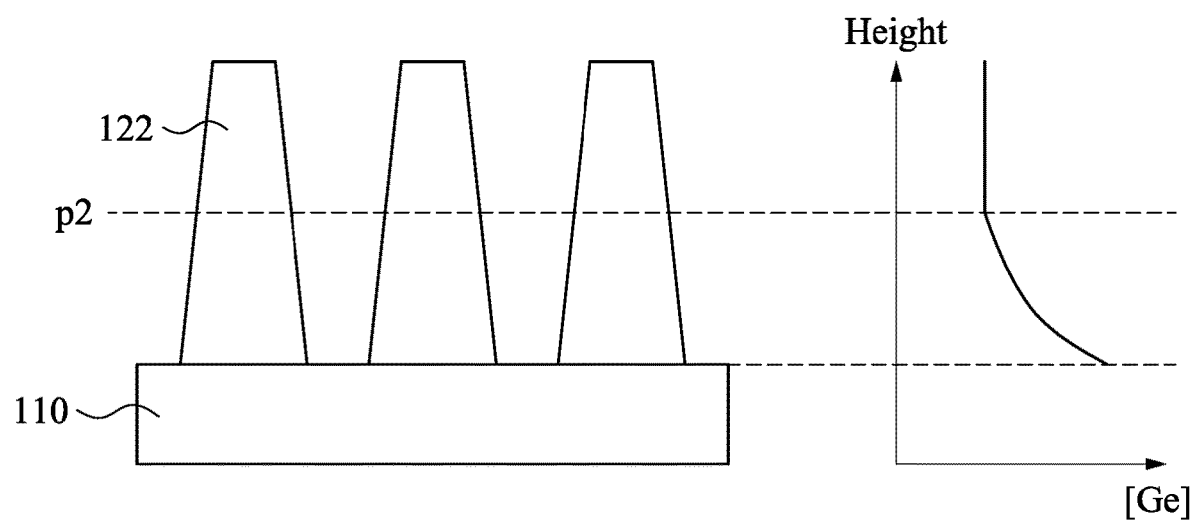
Figure 8:
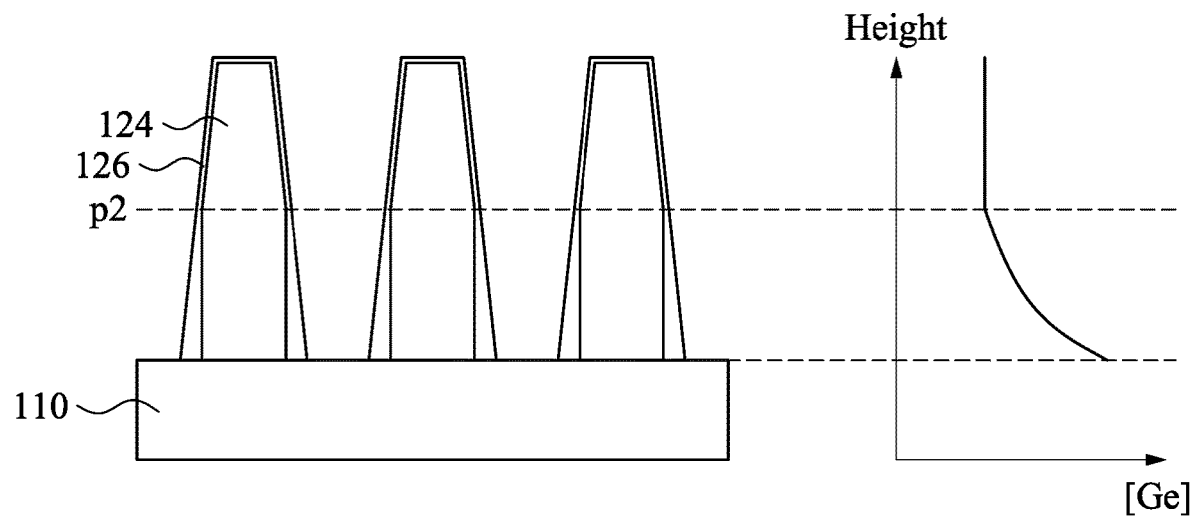

As shown in FIGS. 6-7, the semiconductor layer 120 is patterned to form a preliminary fin 122. As shown in FIGS. 7-8, an oxidation process is performed to oxidize an exposed surface of the preliminary fin 122 to form a trimmed fin 124 covered by an oxide layer 126. In some embodiments, as shown in FIG. 8, the oxide layer 126 has a first thickness on a top surface of the trimmed fin 124 and a second thickness on a side surface of the trimmed fin 124, and the first thickness is equal to the second thickness. In some embodiments, the thickness of the oxide layer 126 is constant from top to the position p2. In some embodiments, the thickness of the oxide layer 126 is gradually increased from the position p2 to bottom.

Figure 9:
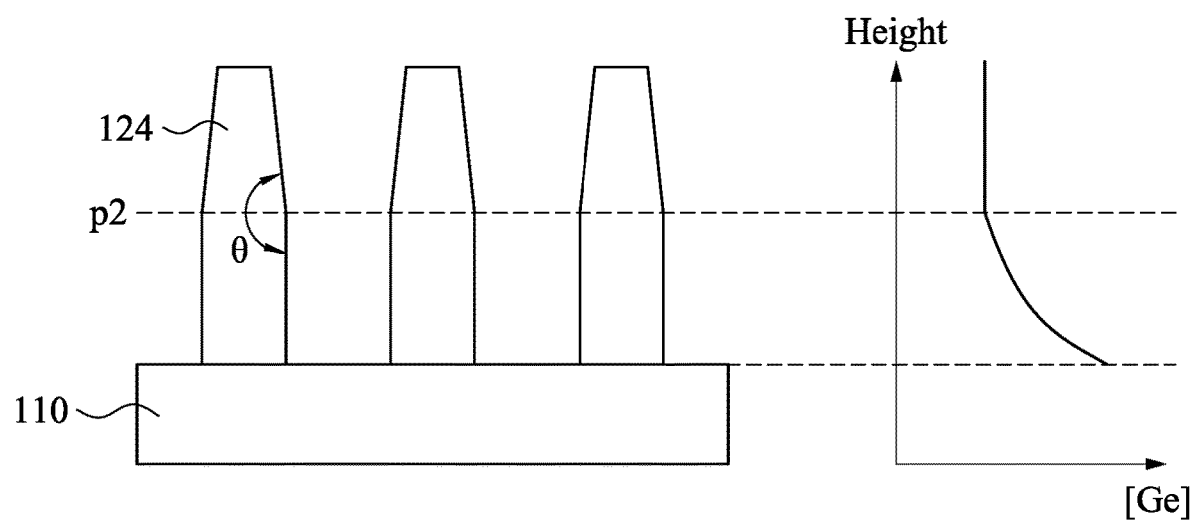

As shown in FIGS. 8-9, the oxide layer 126 is removed to obtain the trimmed fin 124. In some embodiments, as shown in FIGS. 7 and 9, the fin bottom width is significantly decreased, and thus can solve the issues mentioned above. In some embodiments, as shown in FIG. 9, a side surface of the formed trimmed fin 124 has a corner, and the corner has an inner angle θ greater than or equal to 170 degrees and less than 180 degrees, or greater than 180 degrees and less than or equal to 190 degrees.

Figure 10:
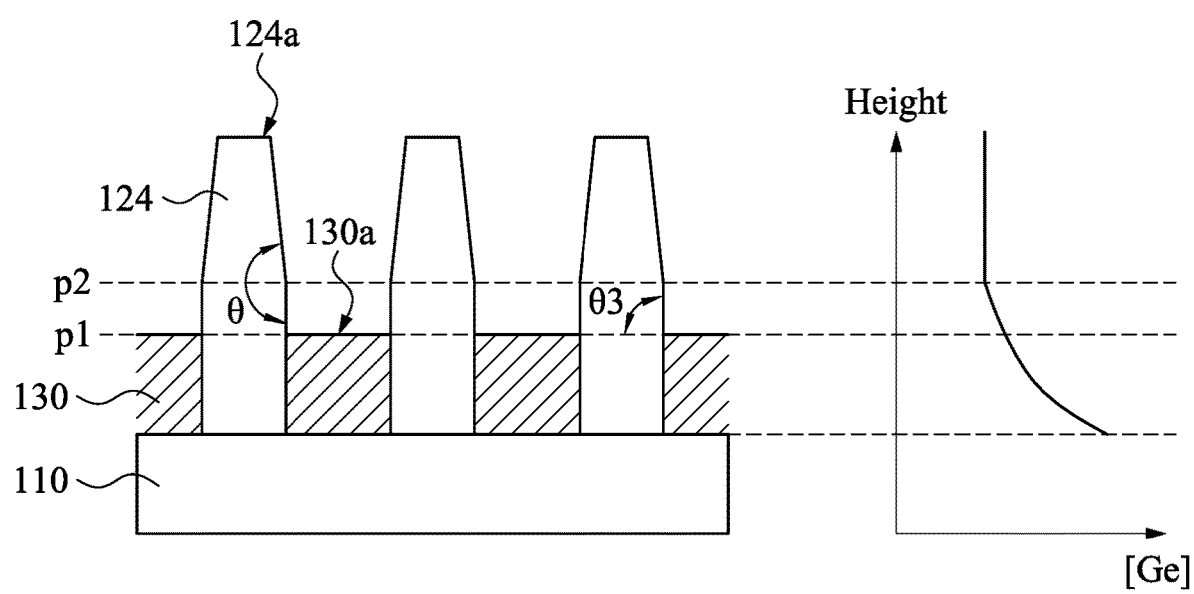

In some embodiments, as shown in FIGS. 9 and 10, an insulating layer 130 is formed laterally adjacent to a bottom of the trimmed fin 124 after the trimmed fin 124 is obtained. In some embodiments, a position p1 of the trimmed fin 124 has a height same as a height of a top surface 130a of the insulating layer 130. In some embodiments, the position p1 is lower than the corner. In some embodiments, an angle θ3 between a horizontal cross-sectional plane through the position p1 of the trimmed fin 124 and a side surface thereof is in a range of from 80 degrees to 100 degrees. In some embodiments, the trimmed fin 124 has a first germanium concentration at the top surface 124a of the trimmed fin 124 and a second germanium concentration at the position p1 of the trimmed fin 124, and the first germanium concentration is less than the second germanium concentration. In some embodiments, the top surface 124a of the trimmed fin 124 has $Si_{1-x}Ge_x$, and the position p1 of the trimmed fin 124 has $Si_{1-y}Ge_y$, in which x and y represents a real number, and x is greater than or equal to 0, and y is less than or equal to 1, and y minus x is greater than or equal to 0.1.

FIGS. 11-15 are cross-sectional views at various stages of fabricating a trimmed fin in accordance with some embodiments of the present disclosure. Some embodiments of processing steps of FIGS. 11-15 may be same as those of FIGS. 1-5. A difference between the embodiments of FIGS. 11-15 and those of FIGS. 1-5 is the germanium concentration profile of the semiconductor layer, such that the embodiments of FIGS. 11-15 forms a trimmed fin with a different shape.

Figure 11:
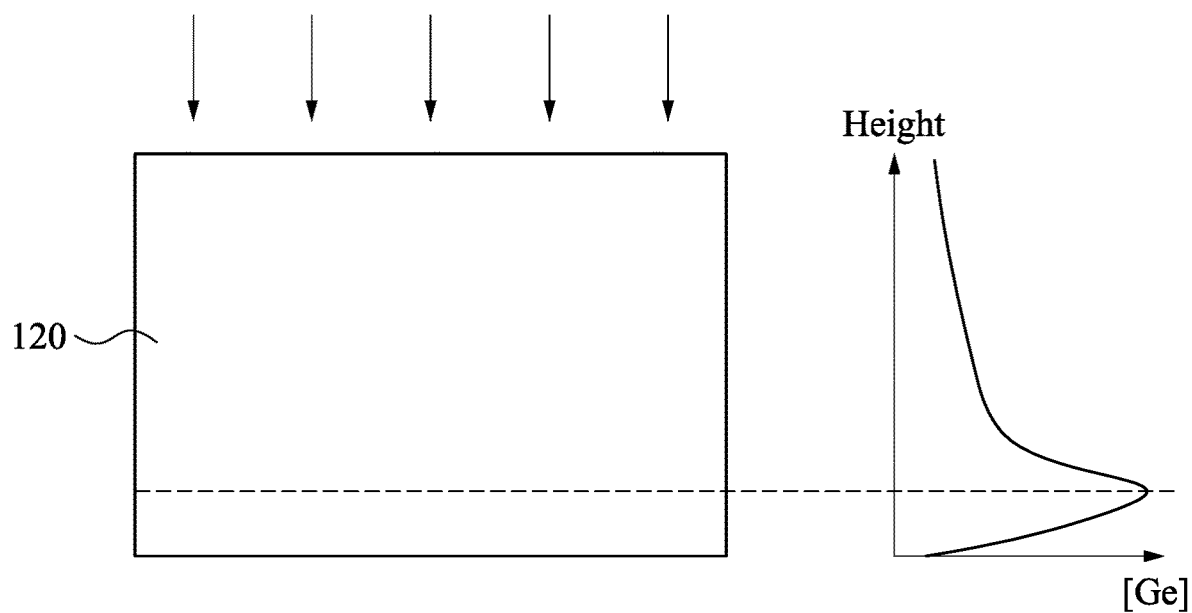
FIGS. 11-15 are cross-sectional views at various stages of fabricating a trimmed fin in accordance with some embodiments of the present disclosure.

Specifically, in some embodiments, as shown in FIG. 11, the germanium concentration is gradually increased from a top surface of the semiconductor layer 120 to a position beneath the top surface of the semiconductor layer 120. In some embodiments, the semiconductor layer 120 has a germanium concentration peak adjacent to a bottom of the semiconductor layer 120.

Figure 12:
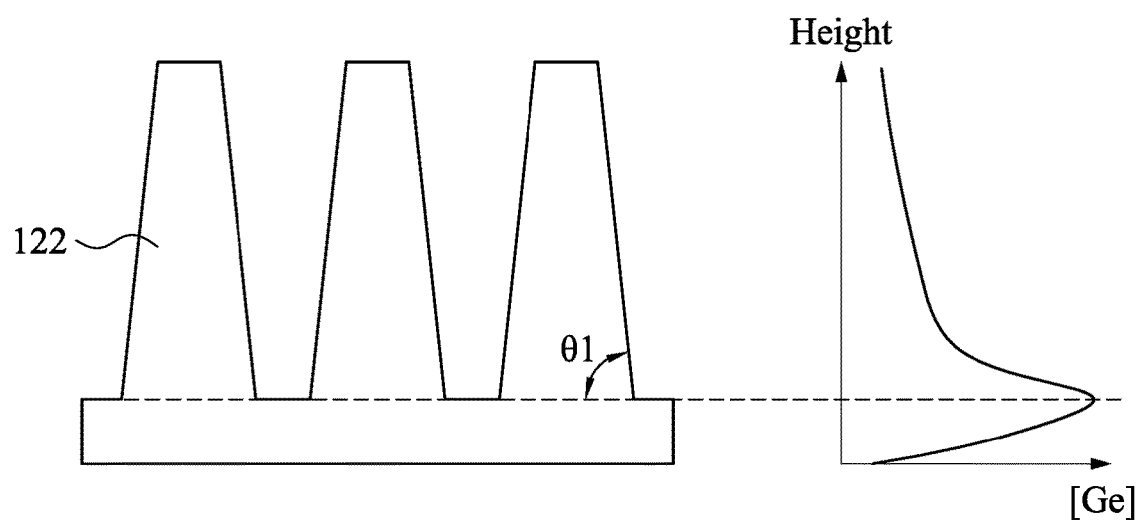

As shown in FIGS. 11-12, the semiconductor layer 120 is patterned to form a preliminary fin 122. In some embodiments, as shown in FIG. 12, an angle θ1 between a horizontal cross-sectional plane through a bottom of the preliminary fin 122 and a side surface thereof is less than 80 degrees.

Figure 13:
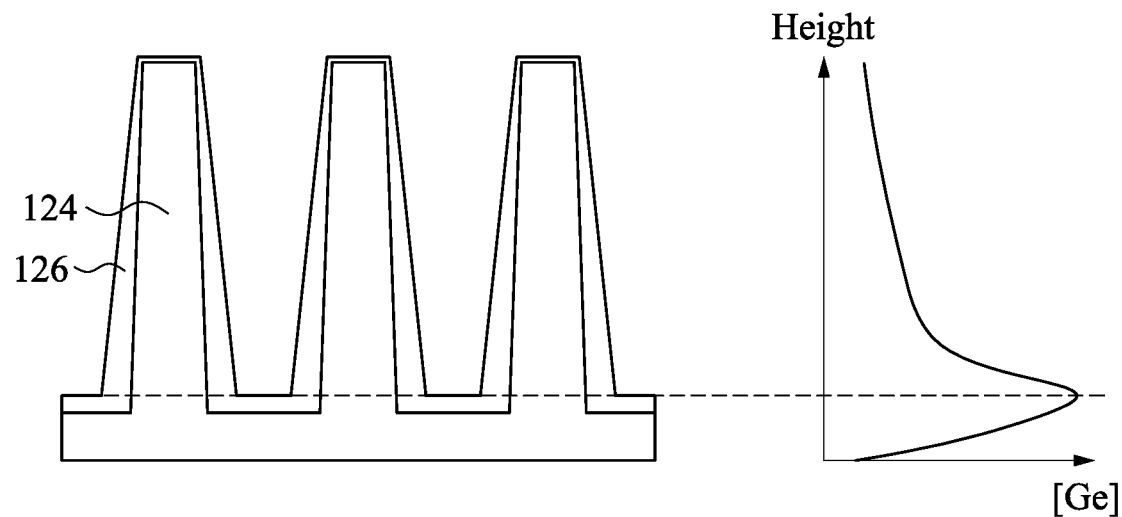

As shown in FIGS. 12-13, an oxidation process is performed to oxidize an exposed surface of the preliminary fin 122 to form a trimmed fin 124 covered by an oxide layer 126. In some embodiments, as shown in FIG. 13, the thickness of the oxide layer 126 is gradually increased from top to bottom.

Figure 14:
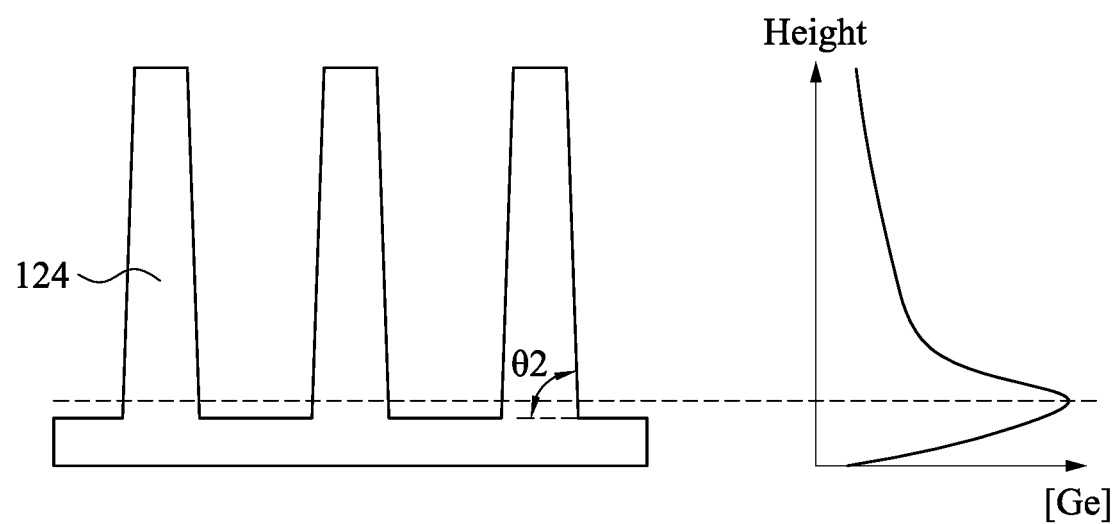

As shown in FIGS. 13-14, the oxide layer 126 is removed to obtain the trimmed fin 124. In some embodiments, as shown in FIGS. 12 and 14, the fin bottom width is significantly decreased, and thus can solve the issues mentioned above. In some embodiments, an angle θ2 between a horizontal cross-sectional plane through a bottom of the trimmed fin 124 and a side surface thereof is in a range of from 80 degrees to 100 degrees. In some embodiments, as shown in FIGS. 12 and 14, the angle θ2 is greater than the angle θ1.

Figure 15:
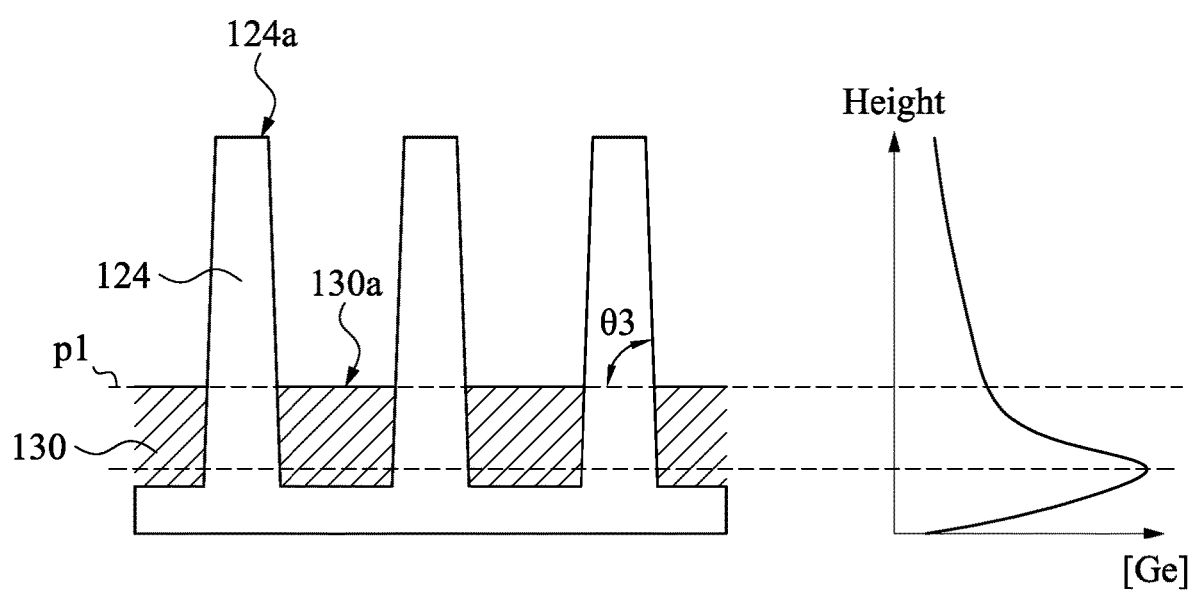

In some embodiments, as shown in FIGS. 14 and 15, an insulating layer 130 is formed laterally adjacent to the bottom of the trimmed fin 124 after the trimmed fin 124 is obtained. In some embodiments, a position p1 of the trimmed fin 124 has a height same as a height of a top surface 130a of the insulating layer 130. In some embodiments, an angle θ3 between a horizontal cross-sectional plane through the position p1 of the trimmed fin 124 and a side surface thereof is in a range of from 80 degrees to 100 degrees. In some embodiments, the trimmed fin 124 has a first germanium concentration at a top surface 124a of the trimmed fin 124 and a second germanium concentration at the position p1 of the trimmed fin 124, and the first germanium concentration is less than the second germanium concentration. In some embodiments, the top surface 124a of the trimmed fin 124 has $Si_{1-x}Ge_x$, and the position p1 of the trimmed fin 124 has $Si_{1-y}Ge_y$, in which x and y represents a real number, and x is greater than or equal to 0, and y is less than or equal to 1, and y minus x is greater than or equal to 0.1.

FIGS. 16-20 are cross-sectional views at various stages of fabricating a trimmed fin in accordance with some embodiments of the present disclosure. Some embodiments of processing steps of FIGS. 16-20 may be same as those of FIGS. 1-5. A difference between the embodiments of FIGS. 16-20 and those of FIGS. 1-5 is the germanium concentration profile of the semiconductor layer, such that the embodiments of FIGS. 16-20 forms a trimmed fin with a different shape.

Figure 16:
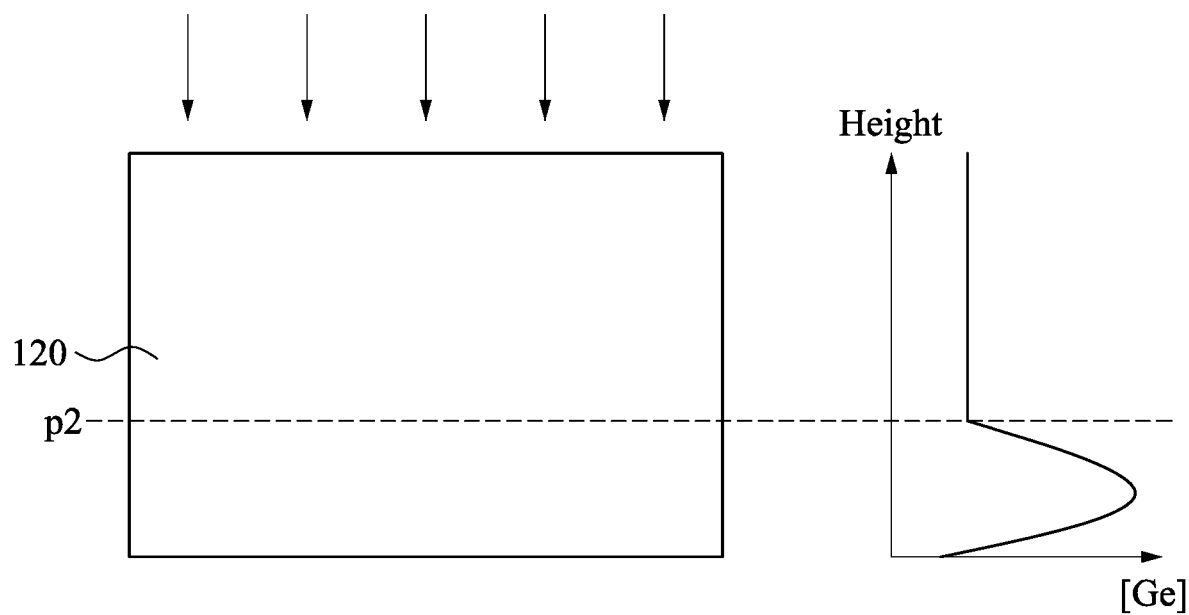
FIGS. 16-20 are cross-sectional views at various stages of fabricating a trimmed fin in accordance with some embodiments of the present disclosure.

Specifically, in some embodiments, as shown in FIG. 16, the germanium concentration of the semiconductor layer 120 is constant from the top surface of the semiconductor layer 120 to a position p2 of the semiconductor layer 120. The position p2 is at an intermediate portion of the semiconductor layer 120. In some embodiments, the semiconductor layer 120 has a germanium concentration peak adjacent to a bottom of the semiconductor layer 120.

Figure 17:
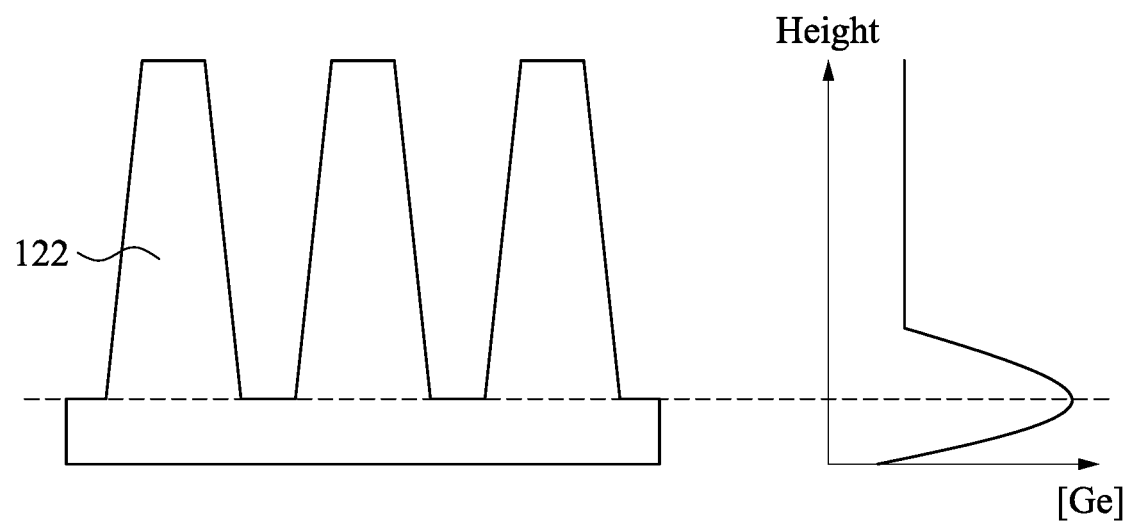
Figure 18:
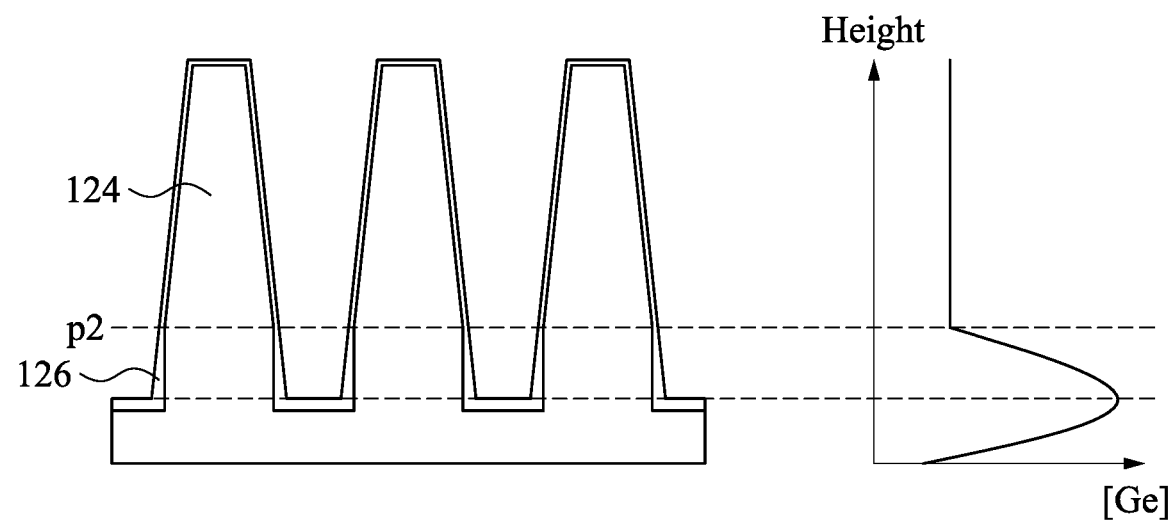

As shown in FIGS. 16-17, the semiconductor layer 120 is patterned to form a preliminary fin 122. As shown in FIGS. 17-18, an oxidation process is then performed to oxidize an exposed surface of the preliminary fin 122 to form a trimmed fin 124 covered by an oxide layer 126. In some embodiments, as shown in FIG. 18, the thickness of the oxide layer 126 is constant from top to the position p2. In some embodiments, the thickness of the oxide layer 126 is gradually increased from the position p2 to bottom.

Figure 19:
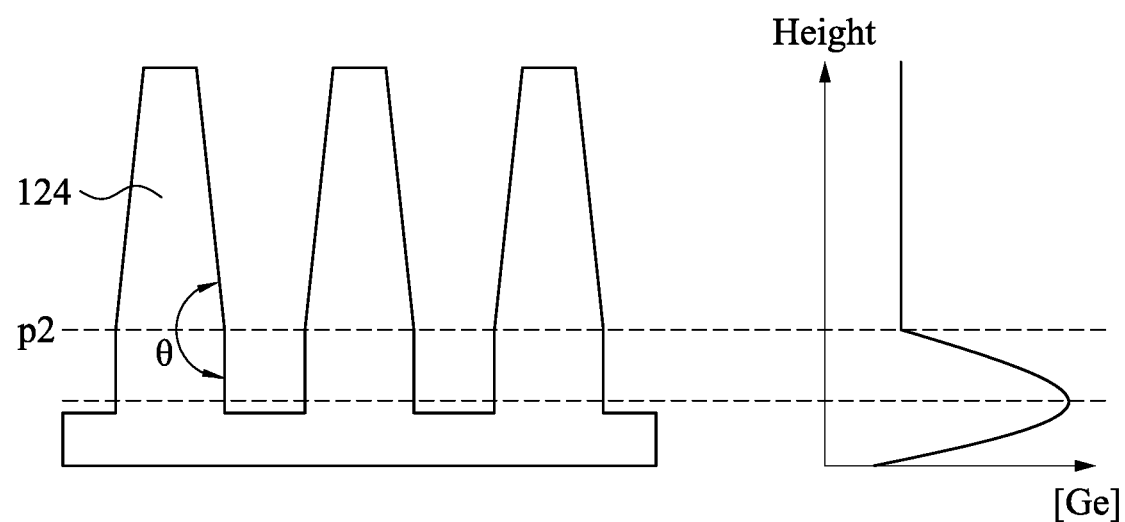

As shown in FIGS. 18-19, the oxide layer 126 is removed to obtain the trimmed fin 124. In some embodiments, as shown in FIGS. 17 and 19, the fin bottom width is significantly decreased, and thus can solve the issues mentioned above. In some embodiments, a side surface of the formed trimmed fin 124 has a corner, and the corner has an inner angle θ greater than or equal to 170 degrees and less than 180 degrees, or greater than 180 degrees and less than or equal to 190 degrees.

Figure 20:
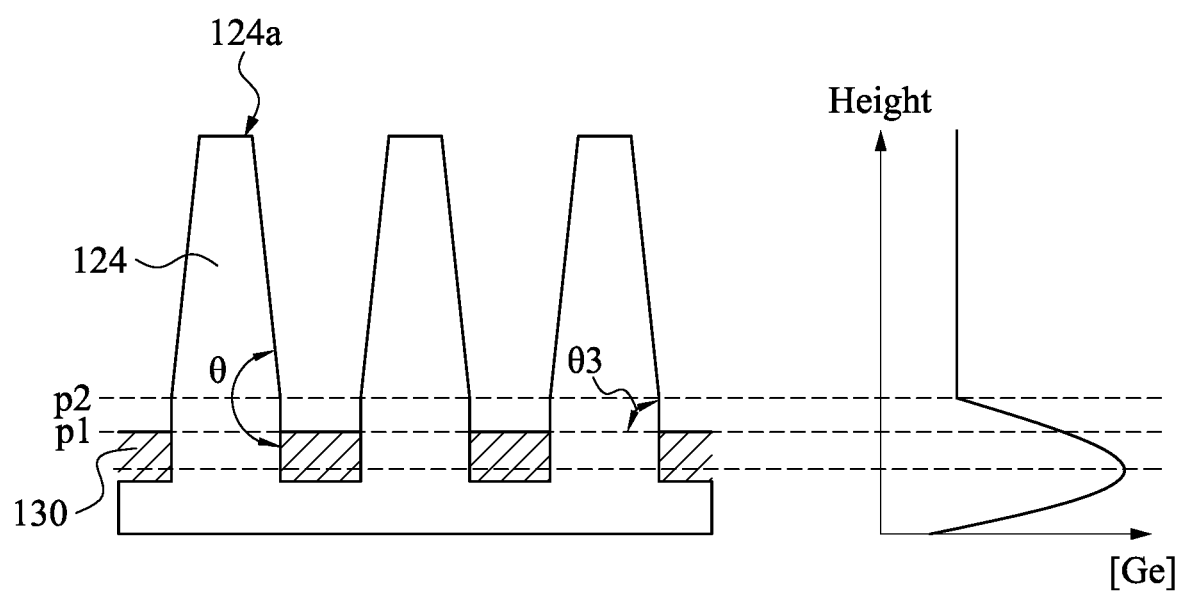

In some embodiments, as shown in FIGS. 19 and 20, an insulating layer 130 is formed laterally adjacent to a bottom of the trimmed fin 124 after the trimmed fin 124 is obtained. In some embodiments, a position p1 of the trimmed fin 124 has a height same as a height of a top surface 130a of the insulating layer 130. In some embodiments, the position p1 is lower than the corner. In some embodiments, an angle θ3 between a horizontal cross-sectional plane through the position p1 of the trimmed fin 124 and a side surface thereof is in a range of from 80 degrees to 100 degrees. In some embodiments, the trimmed fin 124 has a first germanium concentration at the top surface 124a of the trimmed fin 124 and a second germanium concentration at the position p1 of the trimmed fin 124, and the first germanium concentration is less than the second germanium concentration. In some embodiments, the top surface 124a of the trimmed fin 124 has $Si_{1-x}Ge_x$, and the position p1 of the trimmed fin 124 has $Si_{1-y}Ge_y$, in which x and y represents a real number, and x is greater than or equal to 0, and y is less than or equal to 1, and y minus x is greater than or equal to 0.1.

FIGS. 21-25 are cross-sectional views at various stages of fabricating a trimmed fin in accordance with some embodiments of the present disclosure. Some embodiments of processing steps of FIGS. 21-25 may be same as those of FIGS. 1-5. A difference between the embodiments of FIGS. 21-25 and those of FIGS. 1-5 is the germanium concentration profile of the semiconductor layer, such that the embodiments of FIGS. 21-25 forms a trimmed fin with a different shape. Another difference is that an insulating layer is formed laterally adjacent to a bottom of the preliminary fin before oxidizing an exposed surface of the preliminary fin.

Figure 21:
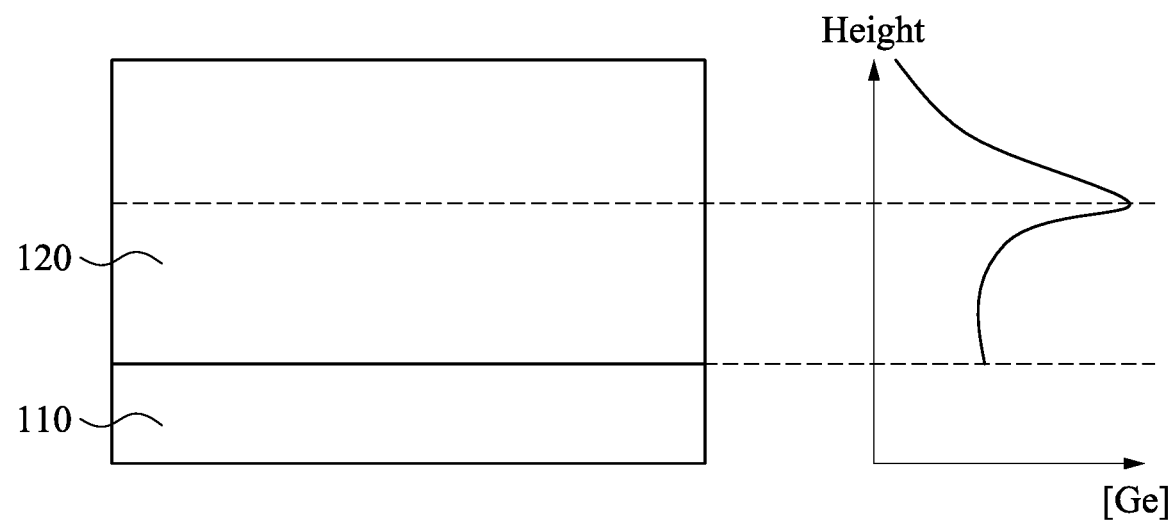
FIGS. 21-25 are cross-sectional views at various stages of fabricating a trimmed fin in accordance with some embodiments of the present disclosure.
Figure 22:
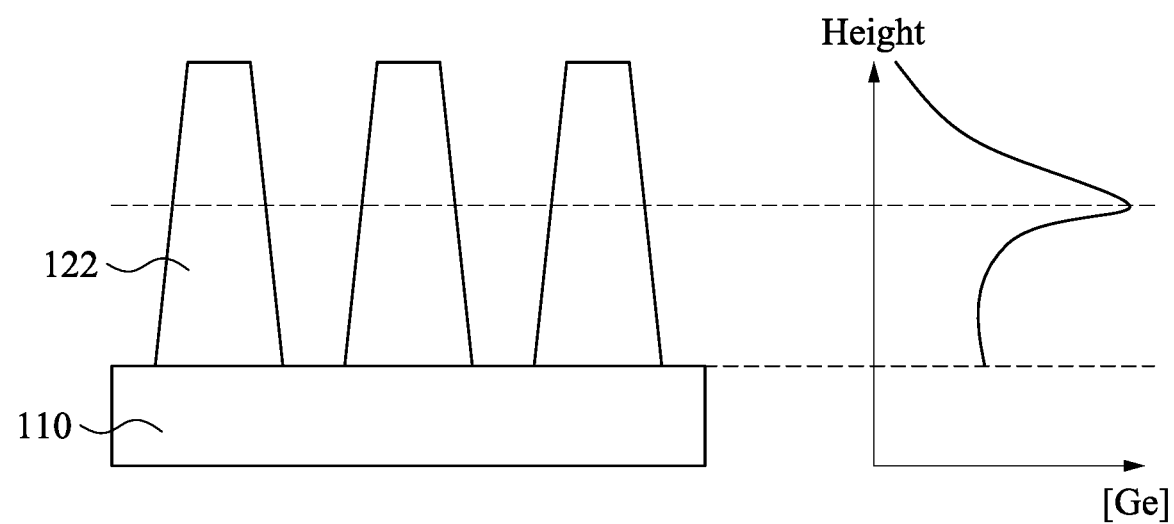

Specifically, in some embodiments, as shown in FIG. 21, the semiconductor layer 120 has a germanium concentration peak at an intermediate portion of the semiconductor layer 120. As shown in FIGS. 21-22, the semiconductor layer 120 is patterned to form a preliminary fin 122.

Figure 23:
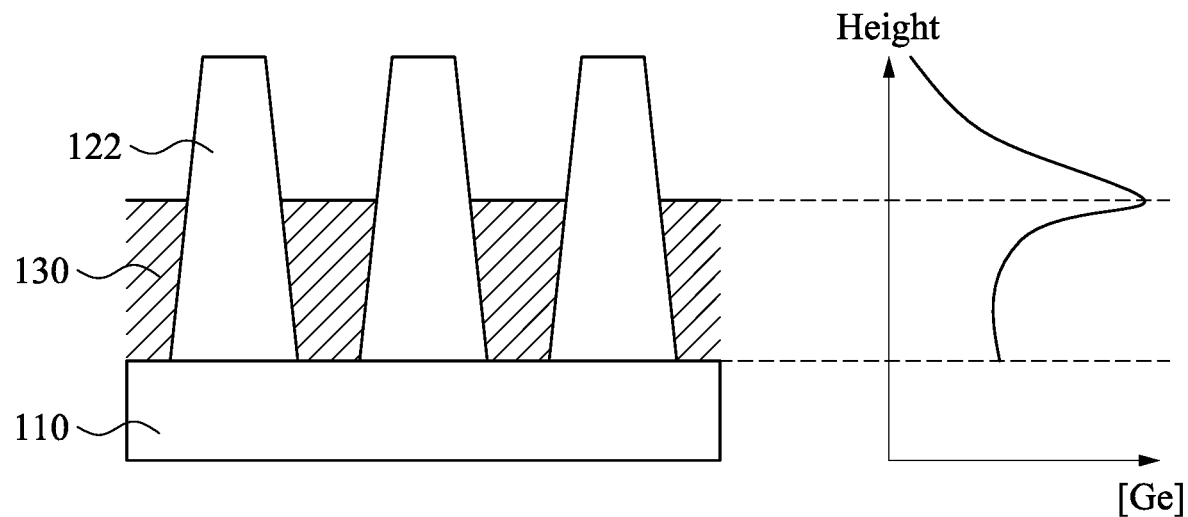
Figure 24:
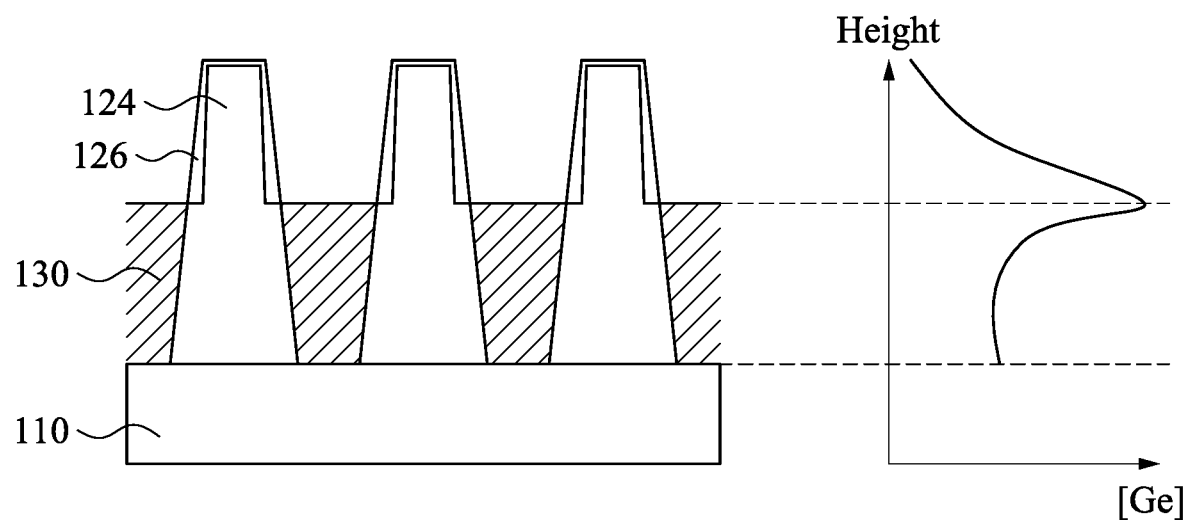

As shown in FIGS. 22-23, an insulating layer 130 is formed laterally adjacent to a bottom of the preliminary fin 122. As shown in FIGS. 23-24, an oxidation process is performed to oxidize an exposed surface of the preliminary fin 122 to form a trimmed fin 124 covered by an oxide layer 126. In some embodiments, as shown in FIG. 24, the thickness of the oxide layer 126 is gradually increased from top to bottom.

Figure 25:
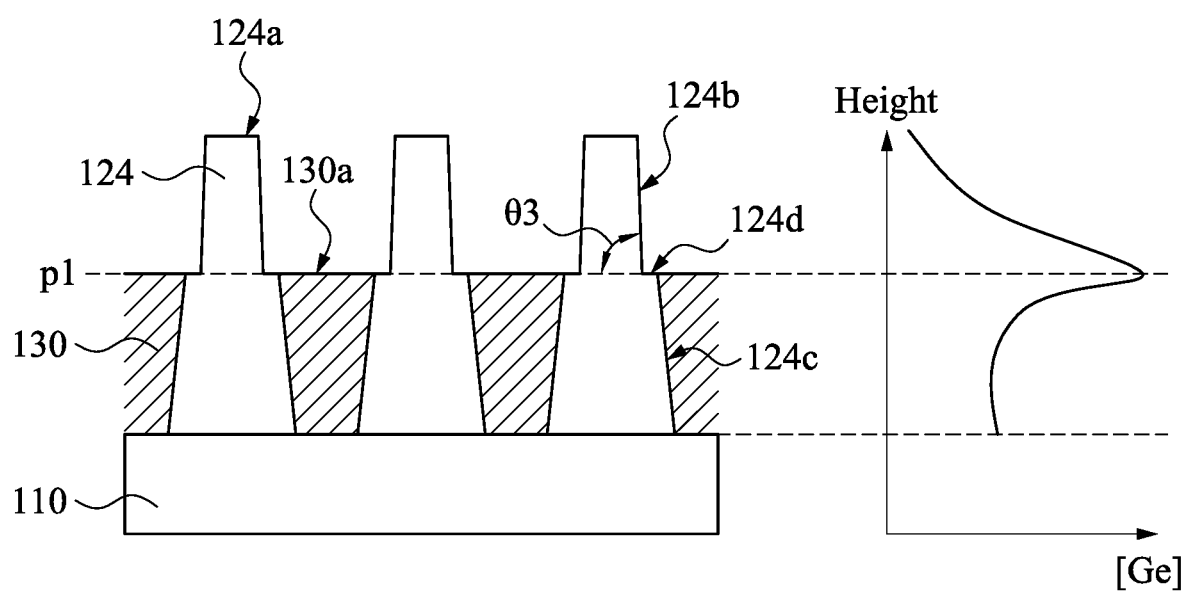

As shown in FIGS. 24-25, the oxide layer 126 is removed to obtain the trimmed fin 124. In some embodiments, as shown in FIGS. 22 and 25, the exposed fin bottom width is significantly decreased, and thus can solve the issues mentioned above. In some embodiments, a position p1 of the trimmed fin 124 has a height same as a height of a top surface 130a of the insulating layer 130. In some embodiments, an angle θ3 between a horizontal cross-sectional plane through the position p1 of the trimmed fin 124 and a side surface thereof is in a range of from 80 degrees to 100 degrees. In some embodiments, the trimmed fin 124 has a first germanium concentration at a top surface 124a of the trimmed fin 124 and a second germanium concentration at the position p1 of the trimmed fin 124, and the first germanium concentration is less than the second germanium concentration. In some embodiments, the top surface 124a of the trimmed fin 124 has $Si_{1-x}Ge_x$, and the position p1 of the trimmed fin 124 has $Si_{1-y}Ge_y$, in which x and y represents a real number, and x is greater than or equal to 0, and y is less than or equal to 1, and y minus x is greater than or equal to 0.1.

FIGS. 26-30 are cross-sectional views at various stages of fabricating a trimmed fin in accordance with some embodiments of the present disclosure. Some embodiments of processing steps of FIGS. 26-30 may be same as those of FIGS. 1-5. A difference between the embodiments of FIGS. 26-30 and those of FIGS. 1-5 is the germanium concentration profile of the semiconductor layer, such that the embodiments of FIGS. 26-30 forms a trimmed fin with a different shape. Another difference is that an insulating layer is formed laterally adjacent to a bottom of the preliminary fin before oxidizing an exposed surface of the preliminary fin.

Figure 26:
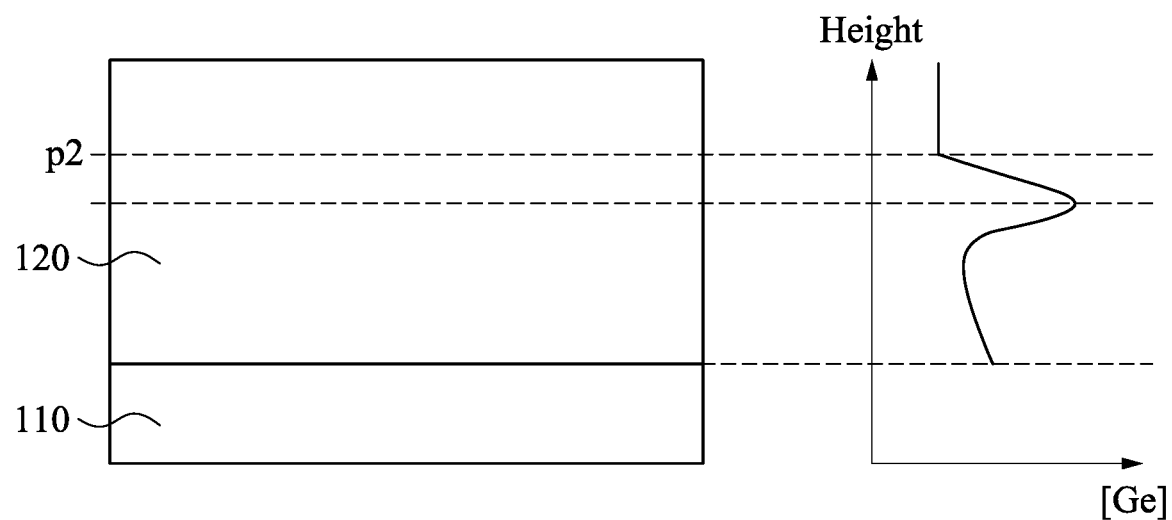
FIGS. 26-30 are cross-sectional views at various stages of fabricating a trimmed fin in accordance with some embodiments of the present disclosure.

Specifically, in some embodiments, as shown in FIG. 26, the germanium concentration of the semiconductor layer 120 is constant from the top surface of the semiconductor layer 120 to a position p2 of the semiconductor layer 120. The position p2 is at an intermediate portion of the semiconductor layer 120. In some embodiments, the semiconductor layer 120 has a germanium concentration peak at the intermediate portion of the semiconductor layer 120 and beneath the position p2.

Figure 27:
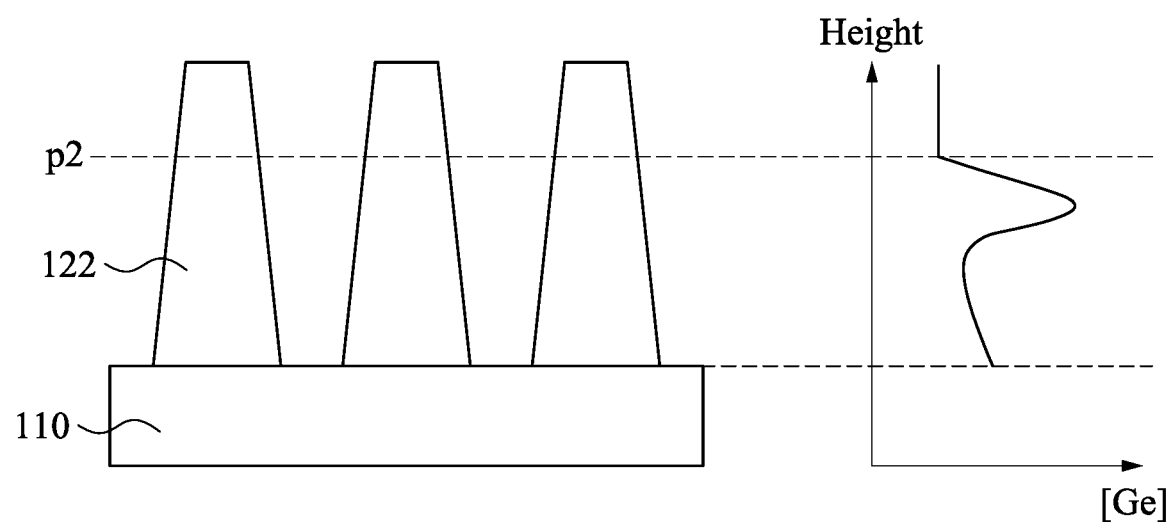
Figure 28:
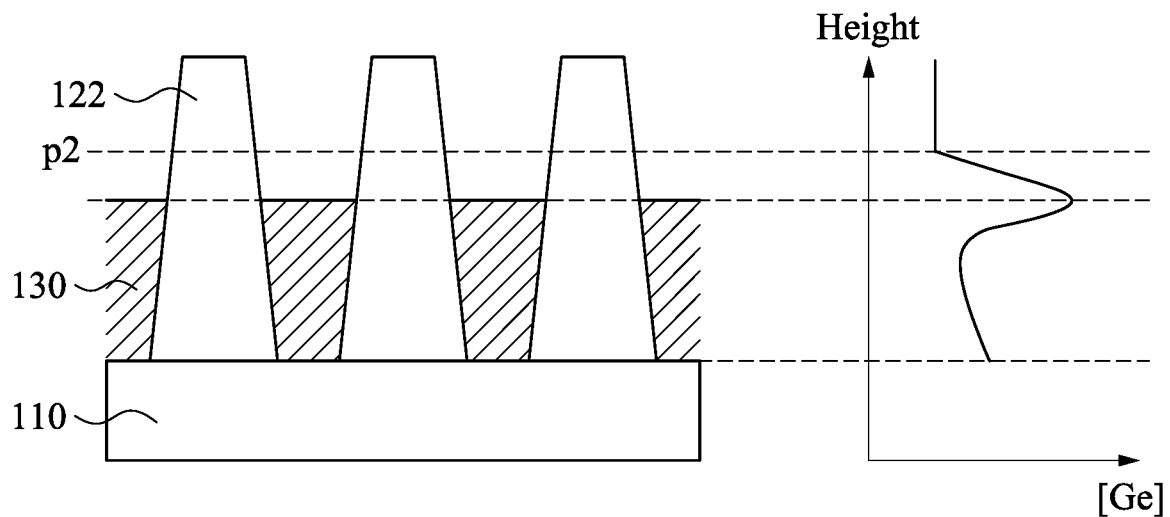
Figure 29:
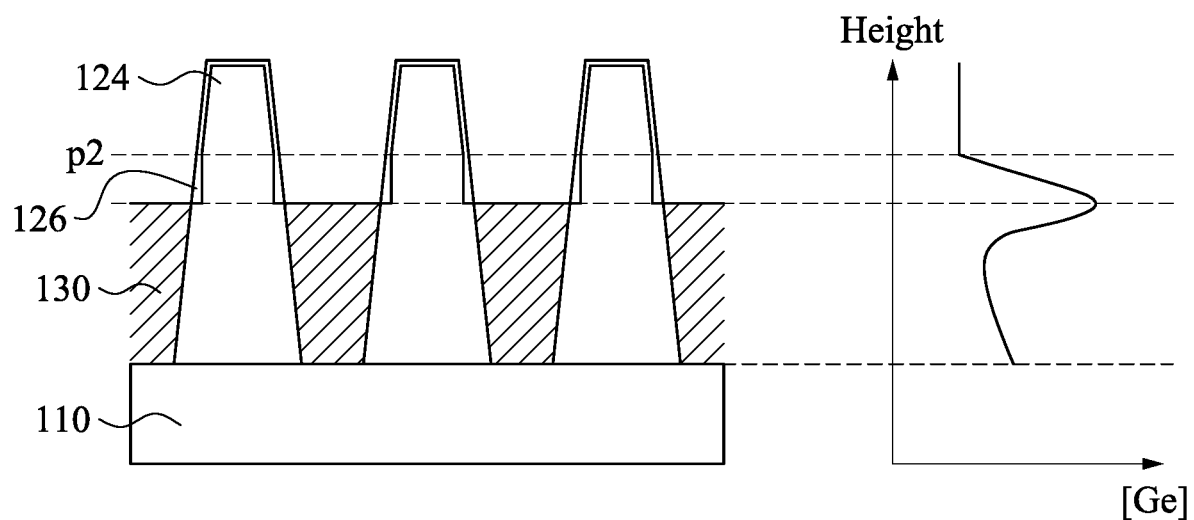

As shown in FIGS. 26-27, the semiconductor layer 120 is patterned to form a preliminary fin 122. As shown in FIGS. 27-28, an insulating layer 130 is formed laterally adjacent to a bottom of the preliminary fin 122. As shown in FIGS. 28-29, an oxidation process is performed to oxidize an exposed surface of the preliminary fin 122 to form a trimmed fin 124 covered by an oxide layer 126. In some embodiments, as shown in FIG. 24, the thickness of the oxide layer 126 is constant from top to the position p2. In some embodiments, the thickness of the oxide layer 126 is gradually increased from the position p2 to bottom.

Figure 30:
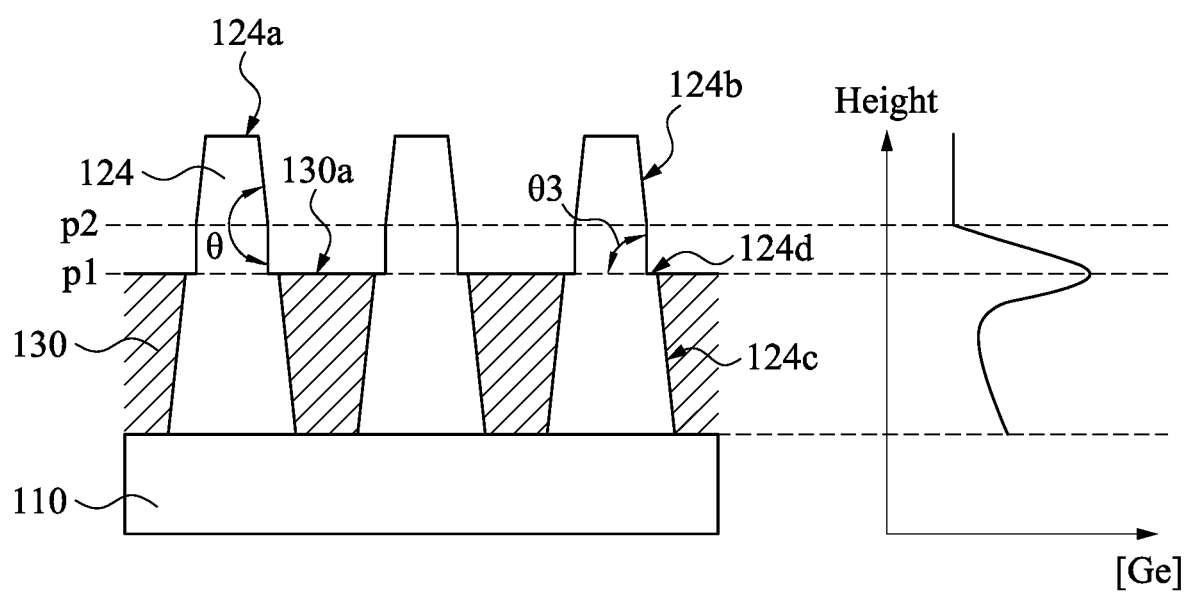

As shown in FIGS. 29-30, the oxide layer 126 is removed to obtain the trimmed fin 124. In some embodiments, as shown in FIGS. 27 and 30, the exposed fin bottom width is significantly decreased, and thus can solve the issues mentioned above. In some embodiments, a position p1 of the trimmed fin 124 has a height same as a height of a top surface 130a of the insulating layer 130. In some embodiments, an angle θ3 between a horizontal cross-sectional plane through the position p1 of the trimmed fin 124 and a side surface thereof is in a range of from 80 degrees to 100 degrees. In some embodiments, the trimmed fin 124 has a first germanium concentration at a top surface 124a of the trimmed fin 124 and a second germanium concentration at the position p1 of the trimmed fin 124, and the first germanium concentration is less than the second germanium concentration. In some embodiments, the top surface 124a of the trimmed fin 124 has $Si_{1-x}Ge_x$, and the position p1 of the trimmed fin 124 has $Si_{1-y}Ge_y$, in which x and y represents a real number, and x is greater than or equal to 0, and y is less than or equal to 1, and y minus x is greater than or equal to 0.1. In some embodiments, a side surface of the formed trimmed fin 124 has a corner, and the corner has an inner angle θ greater than or equal to 170 degrees and less than 180 degrees, or greater than 180 degrees and less than or equal to 190 degrees.

The present disclosure also provides fin structure. Embodiments of the fin structure will be described below in detail. As shown in FIG. 5, 10, 15, 20, 25 or 30, a fin structure includes a fin 124 and an insulating layer 130. The fin 124 including silicon and germanium protrudes from a substrate 110. In some embodiments, the substrate 110 is a silicon germanium strain relaxed buffer, silicon germanium substrate, silicon substrate, germanium substrate, silicon-on-insulator (SOI) substrate, germanium-on-insulator (GOI) substrate, or silicon germanium-on-insulator (SGOI) substrate.

As shown in FIG. 5, 10, 15, 20, 25 or 30, the insulating layer 130 is laterally adjacent to a bottom of the fin 124 and over the substrate 110. The fin 124 has a first germanium concentration at a top surface 124a of the fin 124 and a second germanium concentration at a position beneath the top surface 124a of the fin 124, and the first germanium concentration is less than the second germanium concentration.

In some embodiments, as shown in FIG. 5, 10, 15, 20, 25 or 30, the position p1 of the fin has a height same as a height of a top surface 130a of the insulating layer 130. In some embodiments, an angle θ3 between a horizontal cross-sectional plane through the position p1 of the fin 124 and a side surface of the fin 124 is in a range of from 80 degrees to 100 degrees.

In some embodiments, as shown in FIG. 10, 20 or 30, a side surface of the fin 124 has at least one corner. In some embodiments, the corner of the side surface of the fin has a height higher than a height of a top surface 130a of the insulating layer 130. In some embodiments, the corner has an inner angle θ greater than or equal to 170 degrees and less than 180 degrees, or greater than 180 degrees and less than or equal to 190 degrees.

In some embodiments, as shown in FIG. 25 or 30, a side of the fin 124 has a first side surface 124b, a second side surface 124c beneath the first side surface 124c and a horizontal or substantially horizontal side surface 124d connected between the first and second side surfaces 124b and 124c. In some embodiments, the horizontal or substantially horizontal side surface 124d is coplanar or substantially coplanar with the top surface 130a of the insulating layer 130.

The present disclosure provides another fin structure. Embodiments of the fin structure will be described below in detail. Referring to FIG. 25 or 30, a fin structure includes a fin 124 and an insulating layer 130. The fin 124 including silicon and germanium protrudes from a substrate 110. The insulating layer 130 is laterally adjacent to a bottom of the fin 124 and over the substrate 110.

Still referring to FIG. 25 or 30, a side of the fin 124 has a first side surface 124b, a second side surface 124c beneath the first side surface 124c and a horizontal or substantially horizontal side surface 124d connected between the first and second side surfaces 124b and 124c. In some embodiments, the horizontal or substantially horizontal side surface 124d is coplanar or substantially coplanar with a top surface 130a of the insulating layer 130.

In some embodiments, as shown in FIG. 25 or 30, a position p1 of the trimmed fin 124 has a height same as a height of a top surface 130a of the insulating layer 130. In some embodiments, the trimmed fin 124 has a first germanium concentration at a top surface 124a of the trimmed fin 124 and a second germanium concentration at the position p1 of the trimmed fin 124, and the first germanium concentration is less than or equal to the second germanium concentration.

The present disclosure further provides a method of manufacturing a FinFET device after the fin structure (e.g., the fin structure of FIG. 5, 10, 15, 20, 25 or 30) is formed. FIGS. 31-34 are cross-sectional views at various stages of manufacturing a FinFET device after a fin structure is formed in accordance with some embodiments of the present disclosure.

Figure 31:
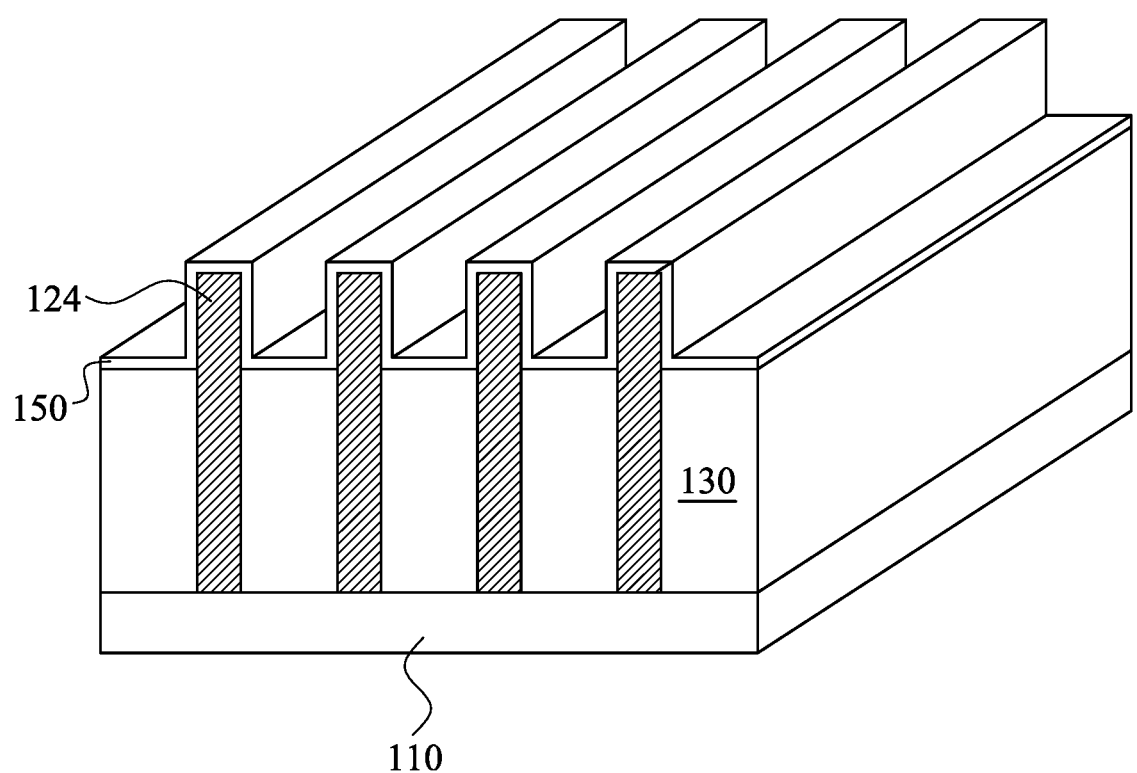
FIGS. 31-34 are cross-sectional views at various stages of manufacturing a FinFET device after a fin structure is formed in accordance with some embodiments of the present disclosure.

As shown in FIG. 31, a gate dielectric layer 150 is blanket formed on the insulating layer 130 and the fins 124. In some embodiments, the gate dielectric layer 150 is a high-k dielectric layer. For example, the gate dielectric layer 150 may include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), or another suitable high-k dielectric material. The high-k material may further include metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina ($HfO_2$—$Al_2O_3$) alloy, or another suitable material. In some embodiments, the gate dielectric layer 150 can be formed by using a operation such as chemical vapor deposition (CVD), plasma enhanced chemical vapor deposition (PECVD), or low pressure chemical vapor deposition (LPCVD).

Figure 32:
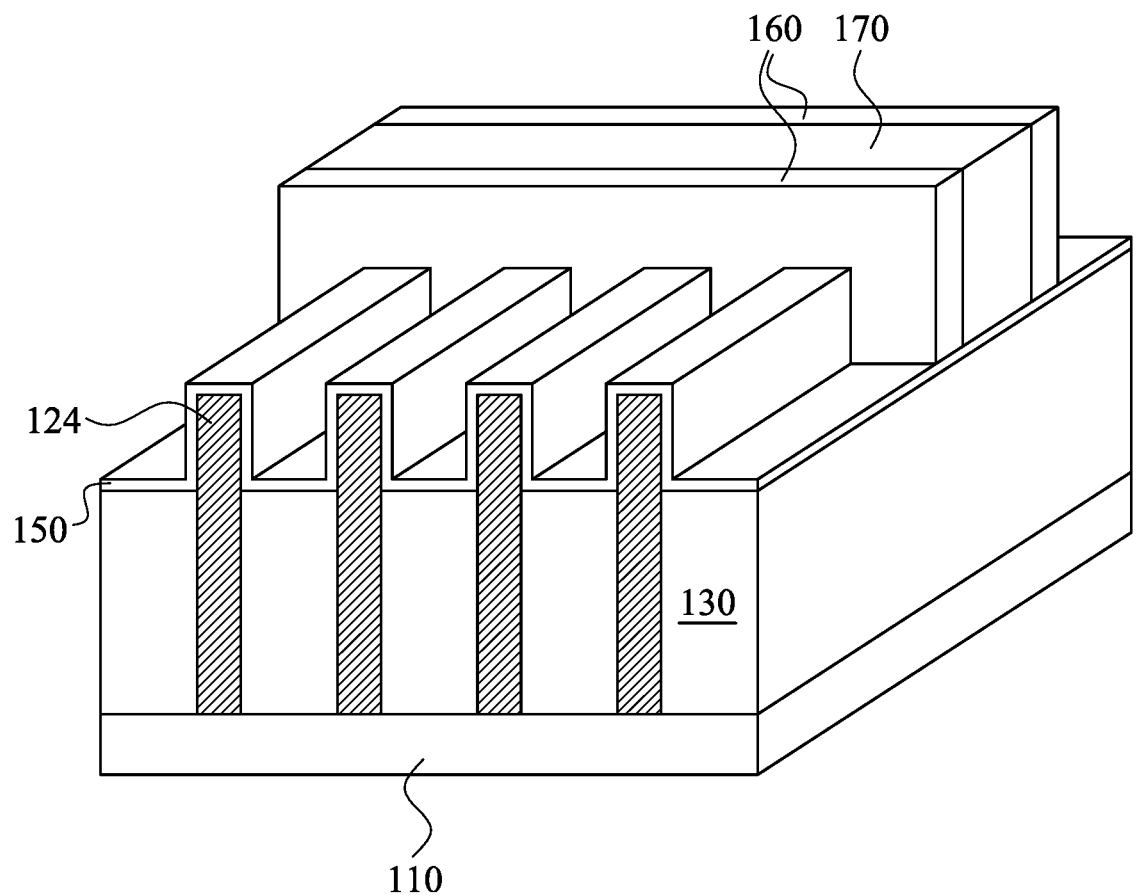

As shown in FIGS. 31 and 32, spacers 160 and a gate electrode 170 are formed on the gate dielectric layer 150. In some embodiments, the spacers 160 are formed from a dielectric material, such as silicon nitride, silicon carbide, silicon oxynitride, other suitable materials, and/or combinations, but embodiments of the present disclosure are not limited thereto. The spacers 160 may be formed by methods utilized to form such a layer, such as chemical vapor deposition (CVD), plasma enhanced CVD, sputter, and other methods known in the art.

In some embodiments, the gate electrode 170 may be formed from a conductive material and may be selected from a group comprising of polycrystalline-silicon (poly-Si), poly-crystalline silicon-germanium (poly-SiGe), metallic nitrides, metallic silicides, metallic oxides, metals, combinations of these, and the like. Examples of metallic nitrides include tungsten nitride, molybdenum nitride, titanium nitride, and tantalum nitride, or their combinations. Examples of metallic silicide include tungsten silicide, titanium silicide, cobalt silicide, nickel silicide, platinum silicide, erbium silicide, or their combinations. Examples of metallic oxides include ruthenium oxide, indium tin oxide, or their combinations. Examples of metal include tungsten, titanium, aluminum, copper, molybdenum, nickel, platinum, etc. The gate electrode 170 may be deposited by chemical vapor deposition (CVD), sputter deposition, or other techniques known and used in the art for depositing conductive materials.

Figure 33:
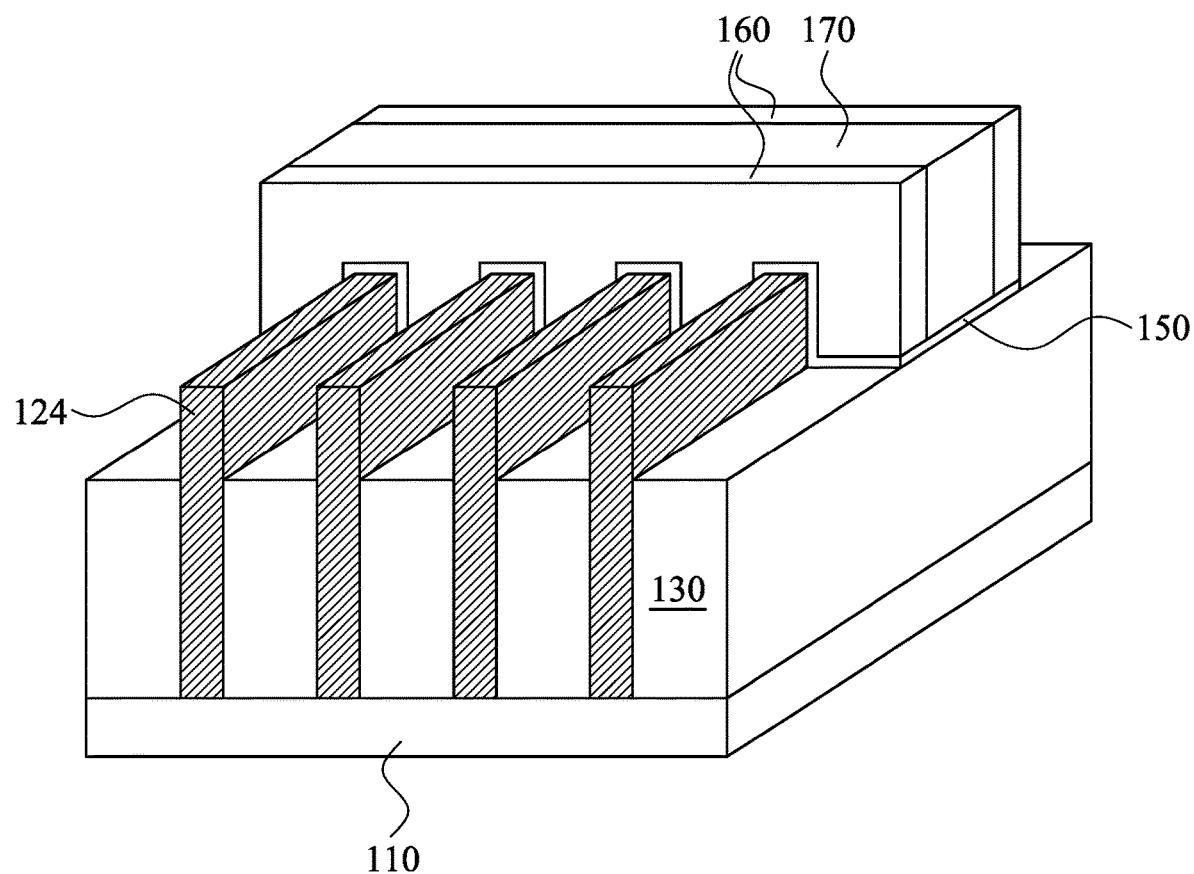

As shown in FIGS. 32 and 33, exposed portions of the gate dielectric layer 150 are removed to expose the fins 124. In some embodiments, the portion of the gate dielectric layer 150 covered by the spacers 160 and the gate electrode 170 remains, and the other portions of the gate dielectric layer 150 not covered by the spacers 160 and the gate electrode 170 are etched to expose underlying fins 124.

Figure 34:
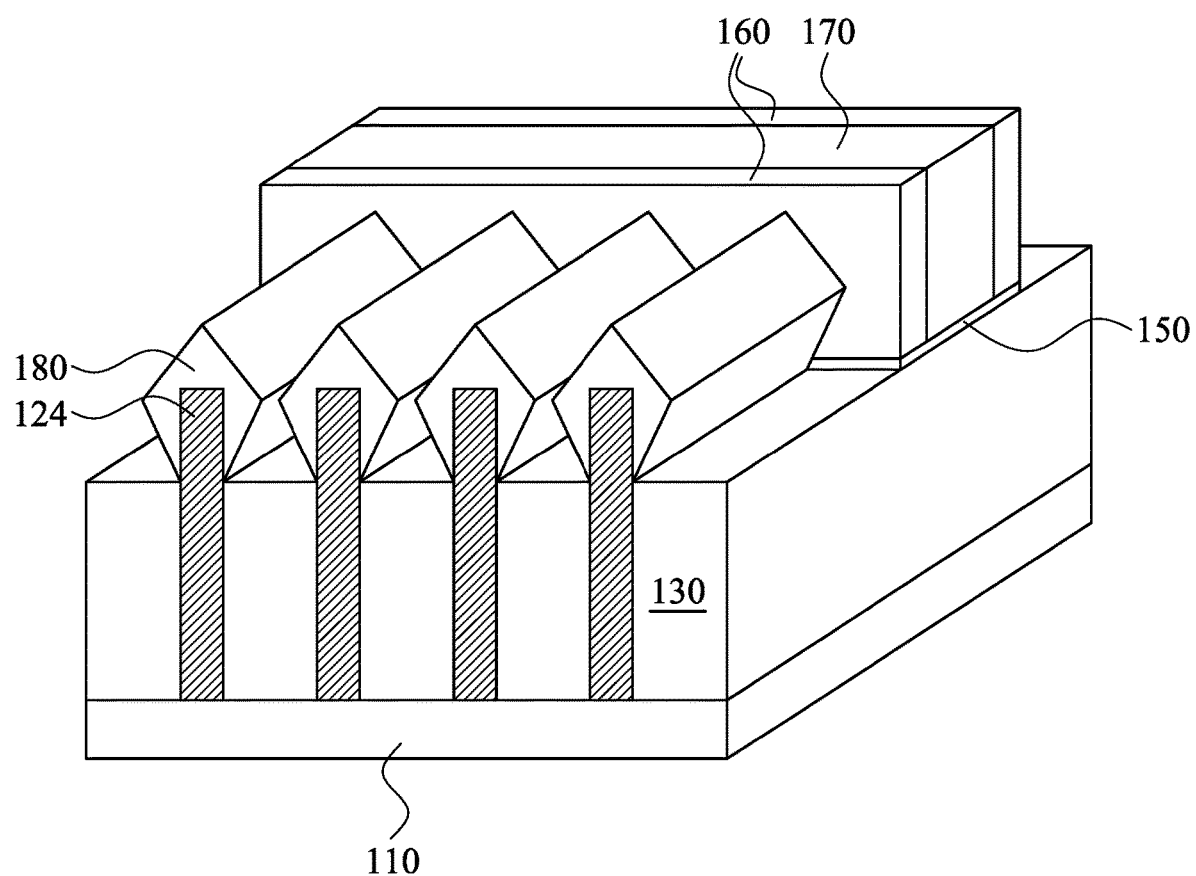

As shown in FIGS. 33 and 34, sources/drains 180 are formed on the fins 124. In some embodiments, the sources/drains 180 covers the fins 124. In some embodiments, the sources/drains 180 are formed from silicon germanium and epitaxially grown from a surface of the fins 124, but embodiments of the present disclosure are not limited thereto. In some embodiments, a doping operation may be conducted on the sources/drains 180 to dope the sources/drains 180 with an n-type or p-type dopant.

In some embodiments, the fin structure (e.g., the fin structure of FIG. 5, 10, 15, 20, 25 or 30) can be applied in other non-planar transistor structures, such as a multi-gate structure, a PI gate structure, an omega gate structure, a gate-all-around structure or other suitable non-planar transistor structures, and is not limited to the embodiments exemplified above.

In accordance with some embodiments of the present disclosure, a method of fabricating a trimmed fin includes: forming a preliminary fin including silicon and germanium protruding from a substrate, in which the preliminary fin has a first germanium concentration at a top surface of the preliminary fin and a second germanium concentration at a position beneath the top surface of the preliminary fin, and the first germanium concentration is less than the second germanium concentration; oxidizing an exposed surface of the preliminary fin to form a trimmed fin covered by an oxide layer; and removing the oxide layer to obtain the trimmed fin.

In accordance with some embodiments of the present disclosure, a fin structure includes a fin including silicon and germanium protruding from a substrate; and an insulating layer laterally adjacent to a bottom of the fin and over the substrate, in which the fin has a first germanium concentration at a top surface of the fin and a second germanium concentration at a position beneath the top surface of the fin, and the first germanium concentration is less than the second germanium concentration.

In accordance with some embodiments of the present disclosure, a fin structure includes a fin including silicon and germanium protruding from a substrate, in which a side of the fin has first side surface, a second side surface beneath the first side surface and a horizontal or substantially horizontal side surface connected between the first and second side surfaces; and an insulating layer laterally adjacent to a bottom of the fin and over the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a trimmed fin, comprising:
   forming a preliminary fin comprising silicon and germanium protruding from a substrate, wherein the preliminary fin has a first germanium concentration at a top surface of the preliminary fin and a second germanium concentration at a position beneath the top surface of the preliminary fin, and the first germanium concentration is less than the second germanium concentration;
   oxidizing an exposed surface of the preliminary fin to form a trimmed fin covered by an oxide layer; and
   removing the oxide layer to obtain the trimmed fin.

2. The method of claim 1, wherein the oxide layer has a first thickness on a top surface of the trimmed fin and a second thickness on a side surface of the trimmed fin, and the first thickness is less than or equal to the second thickness.

3. The method of claim 1, further comprising:
   forming an insulating layer laterally adjacent to a bottom of the trimmed fin after removing the oxide layer to obtain the trimmed fin.

4. The method of claim 1, further comprising:
   forming an insulating layer laterally adjacent to a bottom of the preliminary fin before oxidizing the exposed surface of the preliminary fin.

5. The method of claim 1, wherein the preliminary fin has a maximum germanium concentration at a bottom of the preliminary fin.

6. The method of claim 1, wherein the germanium concentration of the preliminary fin is increased from the top surface of the preliminary fin to a bottom of the preliminary fin.

7. The method of claim 1, wherein the germanium concentration of the preliminary fin is constant from the top surface of the preliminary fin to another position beneath the top surface of the preliminary fin.

8. The method of claim 1, wherein the preliminary fin has a germanium concentration peak adjacent to a bottom of the preliminary fin or at an intermediate portion of the preliminary fin.

9. The method of claim 1, wherein the preliminary fin has $Si_{1-x}Ge_x$ and $Si_{1-y}Ge_y$ respectively at the top surface and the position, and x is greater than or equal to 0, and y is less than or equal to 1, and y minus x is greater than or equal to 0.1.

10. The method of claim 1, further comprising:
    oxidizing an exposed surface of the trimmed fin to form a further trimmed fin covered by another oxide layer; and
    removing the other oxide layer to obtain the further trimmed fin.

11. A method of fabricating a trimmed fin, comprising:
    forming a preliminary fin comprising silicon and germanium protruding from a substrate, wherein the preliminary fin has a first germanium concentration at a top surface of the preliminary fin and a second germanium concentration at a position beneath the top surface of the preliminary fin, and the first germanium concentration is less than the second germanium concentration;
    oxidizing an exposed surface of the preliminary fin to form a trimmed fin covered by an oxide layer, such that an angle formed between a horizontal cross-sectional plane through the position of the trimmed fin and a side surface of the trimmed fin is in a range of from 80 degrees to 100 degrees; and
    removing the oxide layer to obtain the trimmed fin.

12. The method of claim 11, further comprising:
    forming an insulating layer laterally adjacent to a bottom of the trimmed fin after removing the oxide layer to obtain the trimmed fin.

13. The method of claim 12, wherein the insulating layer is formed such that the position of the trimmed fin has a height the same as a height of a top surface of the insulating layer.

14. The method of claim 11, further comprising:
    forming an insulating layer laterally adjacent to a bottom of the preliminary fin before oxidizing the exposed surface of the preliminary fin.

15. The method of claim 11, wherein oxidizing the exposed surface of the preliminary fin is performed such that the trimmed fin has a first side surface, a second side surface beneath the first side surface and misaligned with the first side surface.

16. The method of claim 11, wherein oxidizing the exposed surface of the preliminary fin is performed such that a side surface of the trimmed fin has at least one corner, and the corner of the side surface of the trimmed fin has a height higher than a height of a top surface of an insulating layer.

17. The method of claim 16, wherein the corner has an inner angle greater than or equal to 170 degrees and less than 180 degrees.

18. A method of fabricating a semiconductor device, comprising:
    forming a preliminary fin comprising silicon and germanium protruding from a substrate;
    forming an insulating layer laterally adjacent to a bottom portion of the preliminary fin, wherein an upper portion of the preliminary fin protrudes over a top surface of the insulating layer, and a top surface and sidewalls of the upper portion of the preliminary fin are exposed;
    oxidizing the exposed top surface and sidewalls of the upper portion of the preliminary fin to form a trimmed fin covered by an oxide layer, wherein the oxide layer has a first portion extending along a top surface of the trimmed fin and a second portion extending along sidewalls of the trimmed fin, the first portion of the oxide layer has a first thickness, a bottom of the second portion of the oxide layer has a second thickness, and the second thickness is greater than the first thickness;
    removing the oxide layer to obtain the trimmed fin; and
    forming a gate dielectric layer on the insulating layer and the trimmed fin after removing the oxide layer.

19. The method of claim 18, further comprising:
    forming a gate structure above the gate dielectric layer.

20. The method of claim 19, further comprising:
    removing a portion of the gate dielectric layer exposed by the gate structure after forming the gate structure.

* * * * *